(12) United States Patent
Hsieh

(10) Patent No.: US 12,328,915 B2
(45) Date of Patent: Jun. 10, 2025

(54) SUPERFUNCTION MOSFETS HAVING SHIELDED GATE TRENCH STRUCTURES

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 512 days.

(21) Appl. No.: 17/868,275

(22) Filed: Jul. 19, 2022

(65) Prior Publication Data

US 2024/0030280 A1 Jan. 25, 2024

(51) Int. Cl.
| | |
|---|---|
| H10D 62/10 | (2025.01) |
| H10D 30/01 | (2025.01) |
| H10D 30/66 | (2025.01) |
| H10D 62/13 | (2025.01) |
| H10D 64/27 | (2025.01) |

(52) U.S. Cl.
CPC ....... H10D 62/111 (2025.01); H10D 30/0297 (2025.01); H10D 30/668 (2025.01); H10D 62/157 (2025.01); H10D 64/513 (2025.01)

(58) Field of Classification Search
CPC ............. H10D 30/0297; H10D 30/668; H10D 64/513; H10D 12/481; H10D 62/111
See application file for complete search history.

(56) References Cited

U.S. PATENT DOCUMENTS

2021/0320178 A1* 10/2021 Hossain ............... H10D 62/157

* cited by examiner

*Primary Examiner* — Tucker J Wright
(74) *Attorney, Agent, or Firm* — BACON & THOMAS, PLLC

(57) ABSTRACT

The present invention introduces new shielded gate trench (SGT) superjunction (SJ) MOSFETs having a first type multiple stepped epitaxial (MSE) structure in oxide charge balance (OCB) region and a second type MSE structure in SJ region for improved specific on-resistance Rsp and gate-to-drain charge Qgd. The two-type MSE structures can increase the average doping concentration in drift regions of the SGT SJ MOSFETS, as a result, lower Rsp and higher avalanche capability could be achieved without degrading breakdown voltage.

12 Claims, 30 Drawing Sheets

SUPERFUNCTION MOSFETS HAVING SHIELDED GATE TRENCH STRUCTURES

FIELD OF THE INVENTION

This invention relates generally to semiconductor power devices, and more particularly, to an improved shielded gate trench (SGT) superjunction (SJ) MOSFET (Metal Oxide Semiconductor Field Effect Transistor) having multiple stepped epitaxial (MSE) structures in both SGT and SJ regions.

BACKGROUND OF THE INVENTION

It is well known that both superjunction (SJ) and shielded gate trench (SGT) structures break the traditional silicon limit between breakdown voltage (BV) and specific on-resistance (Rsp) in power MOSFETs. For BV higher than 300 V, the SJ MOSFET has a lower Rsp than the SGT MOSFET. However, for BV lower than 300 V, the SGT MOSFET has more benefits over the SJ MOSFET including lower gate-to-drain capacitance (Cgd) and lower Rsp.

Therefore, there is a need to provide new device configurations to achieve lower Rsp and lower Cgd for the power MOSFET with BV higher than 300V by combining the SGT structure and the SJ structure together with improved features.

SUMMARY OF THE INVENTION

The present invention provides new SGT SJ MOSFETs, wherein the epitaxial layer having a first type MSE structure in an oxide charge balance (OCB) region and a second type MSE structure in a SJ region. With these novel MSE structures, Rsp is significantly reduced as a result of higher average doping concentration in drift region than the conventional SGT and SJ MOSFETs without BV degrading. Moreover, the present invention with the MSE structures would avoid high electric field peaks occurring in channel region for avalanche capability enhancement.

The Rsp can be further reduced with combination of the MSE structures and a multiple stepped oxide (MSO) structure in the OCB region, and an epitaxial layer in a buffer region between a substrate and the OCB region. The MSO structure is a field plate oxide surrounding a shielded gate electrode in a gate trench having a multiple stepped oxide structure with varying thickness decreasing stepwise in a direction from a bottom of the gate trench to a body region, wherein each stepped oxide in the MSO structure is uniform.

According to one aspect, the invention features a SGT SJ MOSFET which is formed in an epitaxial layer of a first conductivity type onto a substrate of the first conductivity type, the SGT SJ MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounds the gate electrode and has less thickness than the first insulating film; an Oxide Charge Balance (OCB) region is formed between two adjacent gate trenches below the body regions and above a bottom of the shielded gate electrode; the body regions, the shielded gate electrode and the source regions are shorted together to a source metal through a plurality of trench contacts; the epitaxial layer in the OCB region has a first type MSE layers with different doping concentrations decreasing stepwise in a direction from a bottom of the shielded gate electrode toward the body regions along sidewalls of the gate trenches, wherein each of the first type MSE layers has a uniform doping concentration as grown; and the SGT SJ MOSFET further comprising a SJ region below the OCB region including alternating first doped columns of the first conductivity type and second doped columns of the second conductivity type arranged in parallel and extend from bottoms of the gate trenches toward the substrate wherein each of the second conductivity columns is disposed between two adjacent gate trenches and connected to the body regions; and a buffer region (NB) of the first conductivity type is formed between the substrate and the SJ region.

According to another aspect, in some preferred embodiments, the SJ region between the OCB region and the buffer region has a single epitaxial layer with a uniform doping concentration, and doping concentrations of the first doped columns are substantially same as that of the second doped columns.

According to another aspect, in some preferred embodiments, the SJ region between the OCB region and the buffer region has a second type MSE layers of the first conductivity type with different doping concentrations; doping concentrations of the second type MSE layers and the first doped columns in the SJ region decreasing stepwise in a direction from a bottom of the OCB region toward the buffer region, whereas doping concentrations of the second doped columns increasing stepwise in a direction from a bottom of the OCB region toward the buffer region; doping concentrations of the first doped columns are lower than doping concentrations of the second doped columns at a bottom of the SJ region near the buffer region; doping concentrations of the first doped columns are higher than doping concentrations of the second doped column at a top of the SJ region near the OCB region; and doping concentrations of the first doped columns are substantially same as doping concentrations of the second doped columns at a middle of the SJ region between a top and a bottom of the SJ region.

According to another aspect, in some preferred embodiments, the SJ region between the OCB region and the buffer region has a second type MSE layers of the first conductivity type with different doping concentrations; doping concentrations of the second type MSE layers and the first doped columns in the SJ region increasing stepwise in a direction from a bottom of the OCB region toward the buffer region, whereas doping concentrations of the second doped columns decreasing stepwise in a direction from a bottom of the OCB region toward the buffer region, doping concentrations of the first doped columns are higher than doping concentrations of the second doped columns at a bottom of the SJ region near the buffer region; doping concentrations of the first doped columns are lower than doping concentrations of the second doped column at a top of the SJ region near the OCB region, and doping concentrations of the first doped columns are substantially same as doping concentrations of the second doped columns at a middle of the SJ region between a top and a bottom of the SJ region.

According to another aspect, in some preferred embodiments, the gate electrode is disposed above the shielded gate electrode. In some other preferred embodiments, the shielded electrode is disposed in the middle and the gate electrode is disposed surrounding upper portion of the shielded electrode.

According to another aspect, in some preferred embodiments, the epitaxial layer in the buffer region has an epitaxial layer with a doping concentration equal to or lower or higher than the doping concentration of a bottom epitaxial layer of the second type MSE layers in the SJ region depending on breakdown voltage rating.

According to another aspect, in some preferred embodiments, the first type MSE layers in the OCB region comprise at least two stepped epitaxial layers of different doping concentrations including a bottom epitaxial layer with a doping concentration D1 and a top epitaxial layer above the bottom epitaxial layer with a doping concentration D2, wherein D2<D1. In some other preferred embodiments, the first type MSE layers in the OCB region comprise at least three stepped epitaxial layers of different doping concentrations including a bottom epitaxial layer with a doping concentration D1, a middle epitaxial layer with a doping concentration D2 and a top epitaxial layer with a doping concentration D3, wherein D3<D2<D1.

According to another aspect, in some preferred embodiments, the epitaxial layer in the source and body regions has a doping concentration same as a top epitaxial layer of the first type MSE layers in the OCB region.

According to another aspect, in some preferred embodiments, widths of said second doped columns in the SJ region decrease in a direction from a bottom of said OCB region toward said buffer region to solve the drain saturation current limitation caused by the JFET (Junction Field Effect Transistor) depletion at bottoms of the first doped columns in the SJ region. The embodiments are specially used for the SJ region having a narrower pitch for lower on-resistance, wherein the width of the JFET depletion region becomes more pronounced in the first doped columns.

According to another aspect, in some preferred embodiments, widths of the second doped columns in the OCB region are equal to or narrower than widths of the second doped columns in the SJ region.

According to another aspect, the present invention also features a SGT SJ MOFET which is formed in an epitaxial layer of a first conductivity type onto a substrate of the first conductivity type, the SGT SJ MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an IPO film, the gate oxide surrounds the gate electrode and has less thickness than the first insulating film; an OCB region is formed between two adjacent gate trenches below the body regions and above a bottom of the shielded gate electrode; the body regions, the shielded gate electrode and the source regions are shorted together to a source metal through a plurality of trench contacts; the first insulating film has a MSO structure with varying thicknesses decreasing stepwise in a direction from bottoms of the gate trenches to the body regions along sidewalls of the gate trenches; and the SGT SJ MOSFET further comprising a SJ region below the OCB region including alternating first doped columns of the first conductivity type and second doped columns of the second conductivity type arranged in parallel and extend form bottoms of the gate trenches toward the substrate wherein each of the second conductivity columns is disposed between two adjacent gate trenches and connected to the body regions; and a buffer region is formed between the substrate and the SJ region.

According to another aspect, in some preferred embodiments, the SJ region between the OCB region and the buffer region has a second type MSE layers of the first conductivity type with different doping concentrations; doping concentrations of the second type MSE layers and doping concentrations of the first doped columns in the SJ region decrease stepwise in a direction from a bottom of the OCB region toward the buffer region, whereas the doping concentrations of the second columns increase stepwise in a direction from a bottom of the OCB region toward the buffer region; doping concentrations of the first doped columns are lower than doping concentrations of the second doped columns at a bottom of the SJ region near the buffer region; doping concentrations of the first doped columns are higher than doping concentrations of the second doped column at a top of the SJ region near the OCB region; and doping concentrations of the first doped columns are substantially same as doping concentrations of the second doped columns at a middle of the SJ region between a top and a bottom of the SJ region.

In some other preferred embodiments, the SJ region between the OCB region and the buffer region has a second type MSE layers of the first conductivity type with different doping concentrations; doping concentrations of the second type MSE layers and doping concentrations of the first doped columns in the SJ region increase stepwise in a direction from a bottom of the OCB region toward the buffer region, whereas the doping concentrations of the second columns decrease stepwise in a direction from a bottom of the OCB region toward the buffer region; doping concentrations of the first doped columns are higher than doping concentrations of the second doped columns at a bottom of the SJ region near the buffer region; doping concentrations of the first doped columns are lower than doping concentrations of the second doped column at a top of the SJ region near the OCB region, and doping concentrations of the first doped columns are substantially same as doping concentrations of the second doped columns at a middle of the SJ region between a top and a bottom of the SJ region.

According to another aspect, in some preferred embodiments, the epitaxial layer in the OCB region is a single epitaxial layer with a uniform doping concentration. In some other preferred embodiments, the epitaxial layer in the OCB region has a first type MSE layers with different doping concentrations decreasing stepwise in a direction from a bottom of the shielded gate electrode toward the body regions along sidewalls of the gate trenches, wherein each of the MSE layers has a uniform doping concentration as grown.

According to another aspect, the present invention also features a SGT SJ MOFET which is formed in an epitaxial layer of a first conductivity type onto a substrate of the second conductivity type, the SGT SJ MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an IPO film, the gate oxide surrounds the gate electrode and has less thickness than the first insulating film; an OCB region is formed between two adjacent gate trenches below the body regions and above a bottom of the shielded gate electrode; a buffer region of the first conductivity type is formed between the substrate and the OCB region; the body regions, the shielded gate electrode and the source regions are shorted together to a source metal through a plurality of trench contacts; the epitaxial layer in the OCB region has a first type MSE layers with different doping concentrations decreasing stepwise in a direction from a bottom of the shielded gate electrode toward the body regions along sidewalls of the gate trenches, wherein each of the MSE layers has a uniform doping concentration as grown, and the SGT SJ MOSFET further comprising a SJ region below the OCB region including alternating first doped columns of the first conductivity type and second doped columns of the second conductivity type arranged in parallel and extend from bottoms of the gate trenches toward the substrate wherein each of the second conductivity columns is disposed between two adjacent gate trenches and connected to the body regions.

According to another aspect, in some preferred embodiments, the SGT SJ MOSFET further comprising a plurality of heavily doped regions of the first conductivity type in the substrate to form a plurality of alternating P+ and N+ regions in the substrate.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
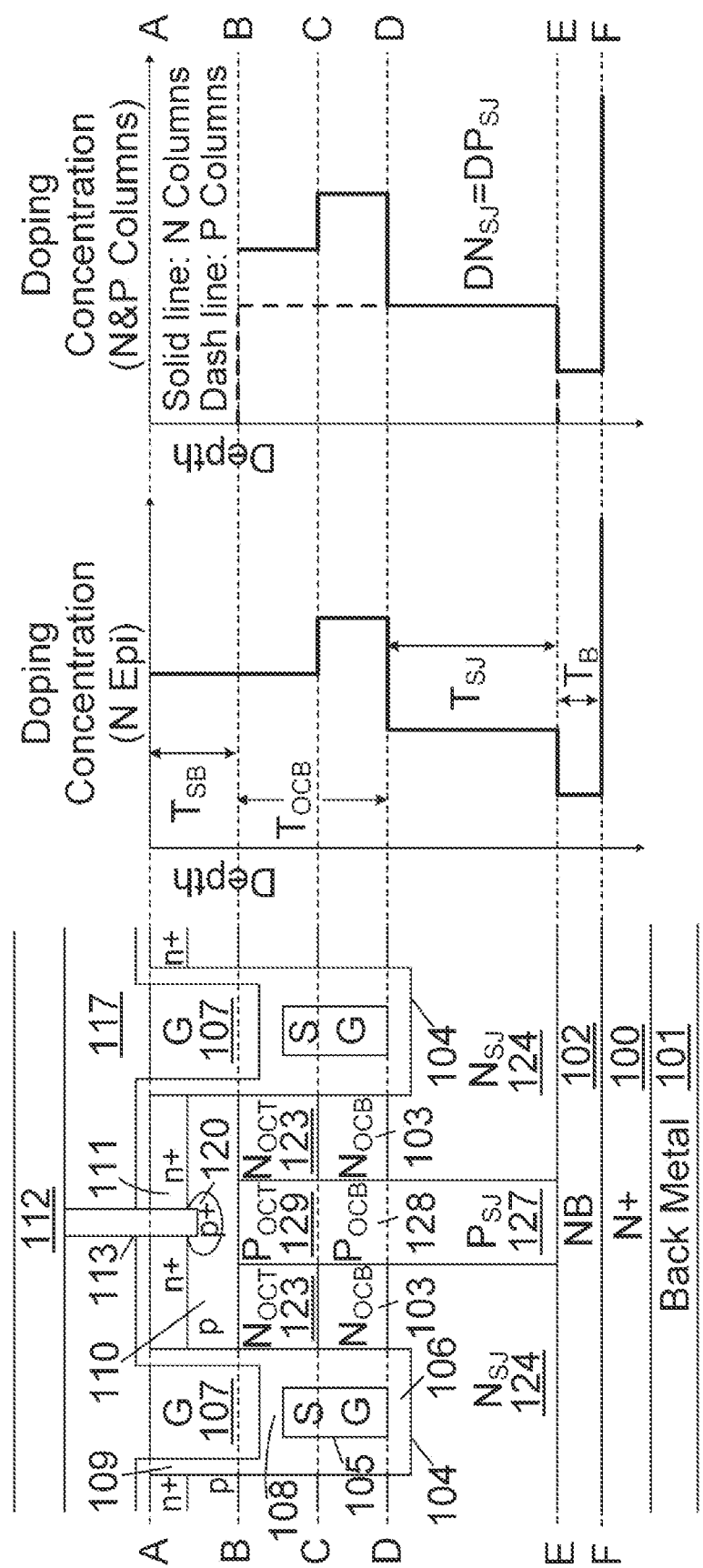
FIG. 1A is a cross-sectional view of a preferred embodiment wherein doping concentration variations of the N type epitaxial layer, the N& P columns are depicted along the vertical direction according to the present invention.

Please refer to FIG. 1A for a preferred embodiment of this invention with new and improved device structure wherein the doping concentration variations of the N type epitaxial layer, the N& P columns as grown are depicted along the vertical direction. The device comprises an N-channel SGT SJ MOSFET formed in an N type epitaxial layer onto an N+ substrate 100 coated with a back metal 101 of Ti/Ni/Ag on rear side as a drain metal. An OCB region $T_{OCB}$ (between B-B and D-D lines) is formed between two adjacent gate trenches 104 below the body regions 110 and above a bottom of the shielded gate electrode 105. The epitaxial layer in the OCB region has a first type MSE layers with two different doping concentrations, including a bottom $1^{st}$ epitaxial layer ($N_{OCB}$, as illustrated between C-C and D-D lines) 103 with a doping concentration D1 and a top $2^{nd}$ epitaxial layer ($N_{OCT}$, as illustrated between B-B and C-C lines) 123 above the bottom $1^{st}$ epitaxial layer 103 with a doping concentration D2, wherein D2<D1, to increase the breakdown voltage and lower the specific on-resistance. A SJ region $T_{SJ}$ (between D-D and E-E lines) is formed between the OCB region $T_{OCB}$ and the buffer region 102, including alternating N type doped columns ($N_{SJ}$, as illustrated) 124 and P type doped columns ($P_{SJ}$, as illustrated) 127 arranged in parallel and extend form bottoms of gate trenches 104 to a buffer region 102 wherein each of the P type doped columns 127 is disposed between two adjacent gate trenches 104 and connected to the body regions 110. The SJ region $T_{SJ}$ has a single epitaxial layer ($N_{SJ}$, as illustrated) 124 with a uniform doping concentration $DN_{SJ}$, and doping concentration $DN_{SJ}$ of the single epitaxial layer and N type doped columns 124 is substantially same as doping concentrations $DP_{SJ}$ of the P type doped columns 127 ($DN_{SJ}=DP_{SJ}$), and is lower than the doping concentration D2 of the top $2^d$ epitaxial layer 123 in the OCB region. A buffer region $T_B$ (NB, as illustrated between E-E and F-F lines) is formed between the N+ substrate 100 and the SJ region. The epitaxial layer in the buffer region has a doping concentration $D_B$ lower than the doping concentration $DN_{SJ}$ of the single epitaxial layer 124 in the SJ region. Moreover, widths of the P type doped columns ($P_{OCB}$ and $P_{OCT}$, as illustrated) 128 and 129 in the OCB region are equal to widths of the P type doped columns 127 in the SJ region, and all the P type doped columns 128, 129 and 127 have the same doping concentration $DP_{SJ}$, which is lower than the doping concentration D2 of the top $2^{nd}$ epitaxial layer 123 in the OCB region. Inside the N type epitaxial layer, a plurality of gate trenches 104 are formed extending from a top surface of the top $2^{nd}$ epitaxial layer 123 in the OCB region $T_{OCB}$ and vertically downward into the single epitaxial layer 124 in the SJ region, wherein trench bottoms of the gate trenches 104 are above a common interface between the buffer region 102 and the SJ region. Inside each of the gate trenches 104, a shielded gate electrode (SG, as illustrated) 105 is disposed in the lower portion and a single gate electrode (G, as illustrated) 107 is disposed in the upper portion above the shielded gate electrode 105. The shielded gate electrode 105 is insulated from the adjacent epitaxial layer by a first insulating film 106, and the gate electrodes 107 is insulated from the adjacent epitaxial layer by a gate oxide 109, wherein the gate oxide 109 has a thinner thickness than the first insulating film 106 which has a uniform thickness along trench sidewalls, meanwhile, the shielded gate electrode 105 and the gate electrode 107 is insulated from each other by an IPO film 108. Between every two adjacent gate trenches 104, the P body regions 110 with n+ source regions 111 thereon are extending near top surface of the top $2^{nd}$ epitaxial layer 123 in the OCB region to form source regions and body regions $T_{SB}$ between A-A and B-B lines. The epitaxial layer in the source and body regions $T_{SB}$ has a doping concentration same as the top $2^{nd}$ epitaxial layer 123 in the OCB region. The P body regions 110, the n+ source regions 111 and the shielded gate electrodes 105 are further shorted together to a source metal 112 through a plurality of trenched contacts 113 filled with contact plugs and barriers implemented by penetrating through a contact insulating layer 117 and surrounded by p+ heavily doped regions 120 around bottoms underneath the n+ source regions 111.

Figure 1B:
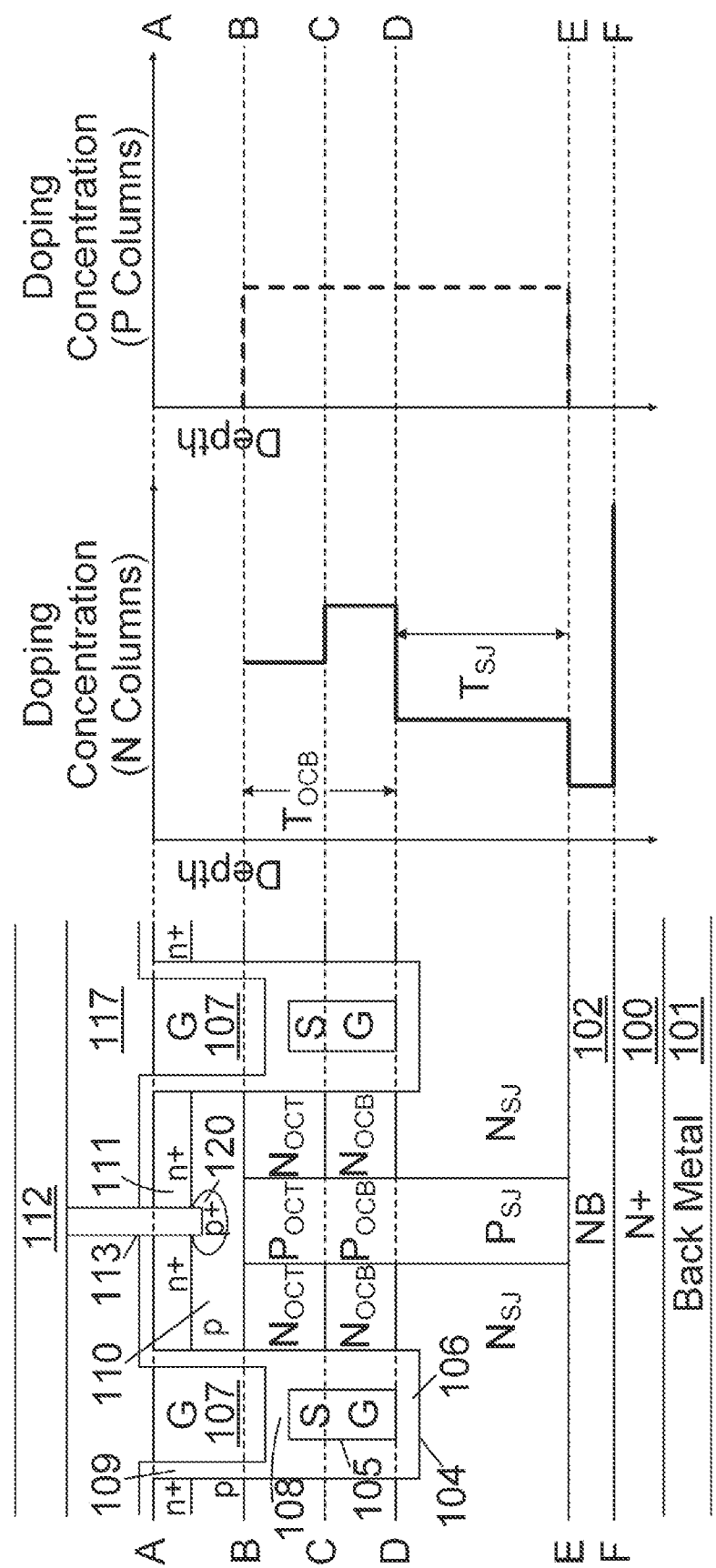
FIG. 1B is the cross-sectional view of the preferred embodiment shown in FIG. 1A, wherein doping concentration variations of the N columns and P columns are depicted separately along the vertical direction according to the present invention.

Please refer to FIG. 1B for the same preferred embodiment of the present invention shown in FIG. 1A, wherein doping concentration variations of the N columns and P columns are depicted separately along the vertical direction according to the present invention.

Figure 1C:
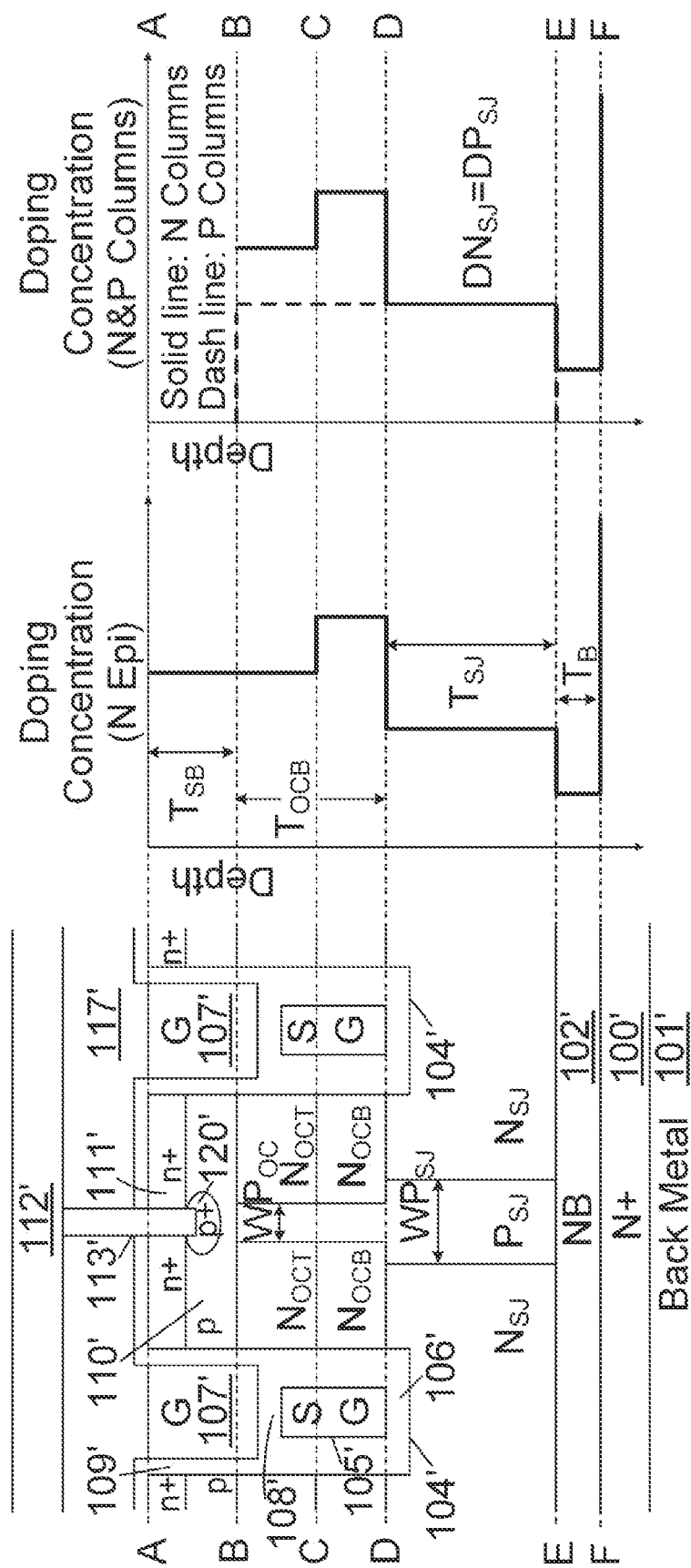
FIG. 1C is a cross-sectional view of another preferred embodiment wherein doping concentration variations of the N type epitaxial layer, the N& P columns are depicted along the vertical direction according to the present invention.

Please refer to FIG. 1C for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 1A with the same doping concentrations of the N type epitaxial layer and the N& P columns in FIG. 1A, except that, in FIG. 1C, widths of the P type doped columns in the OCB region ($WP_{OC}$) are narrower than widths of the P type doped columns in the SJ region ($WP_{SJ}$), that is $WP_{OC}<WP_{SJ}$.

Figure 1D:
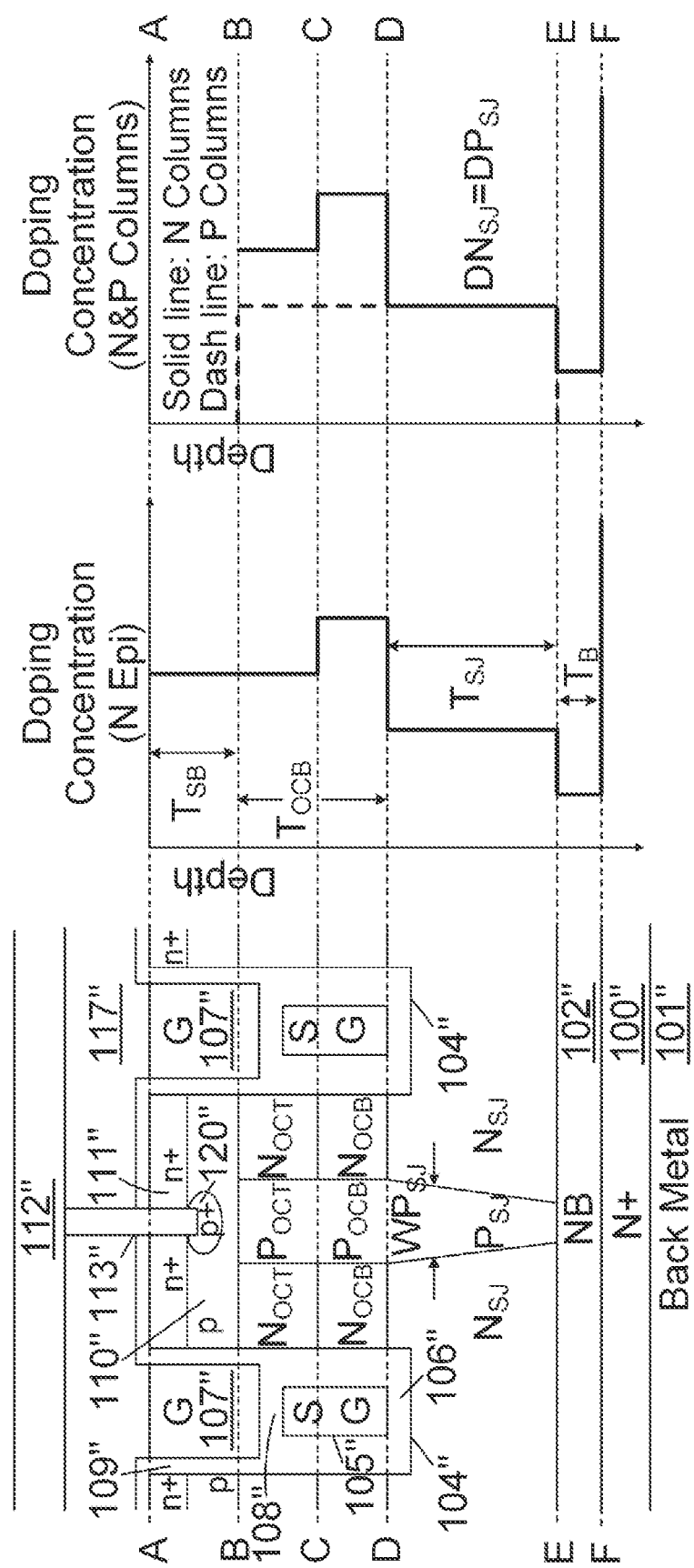
FIG. 1D is a cross-sectional view of another preferred embodiment wherein doping concentration variations of the N type epitaxial layer, the N& P columns are depicted along the vertical direction according to the present invention.

Please refer to FIG. 1D for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 1A with the same doping concentrations of the N type epitaxial layer and the N& P columns in FIG. 1A, except that, in FIG. 1D, the P type doped columns in the SJ region have a sloped shape, and widths of the P type doped columns in the SJ region decrease linearly from a bottom of the OCB region toward the buffer region 102".

Figure 2A:
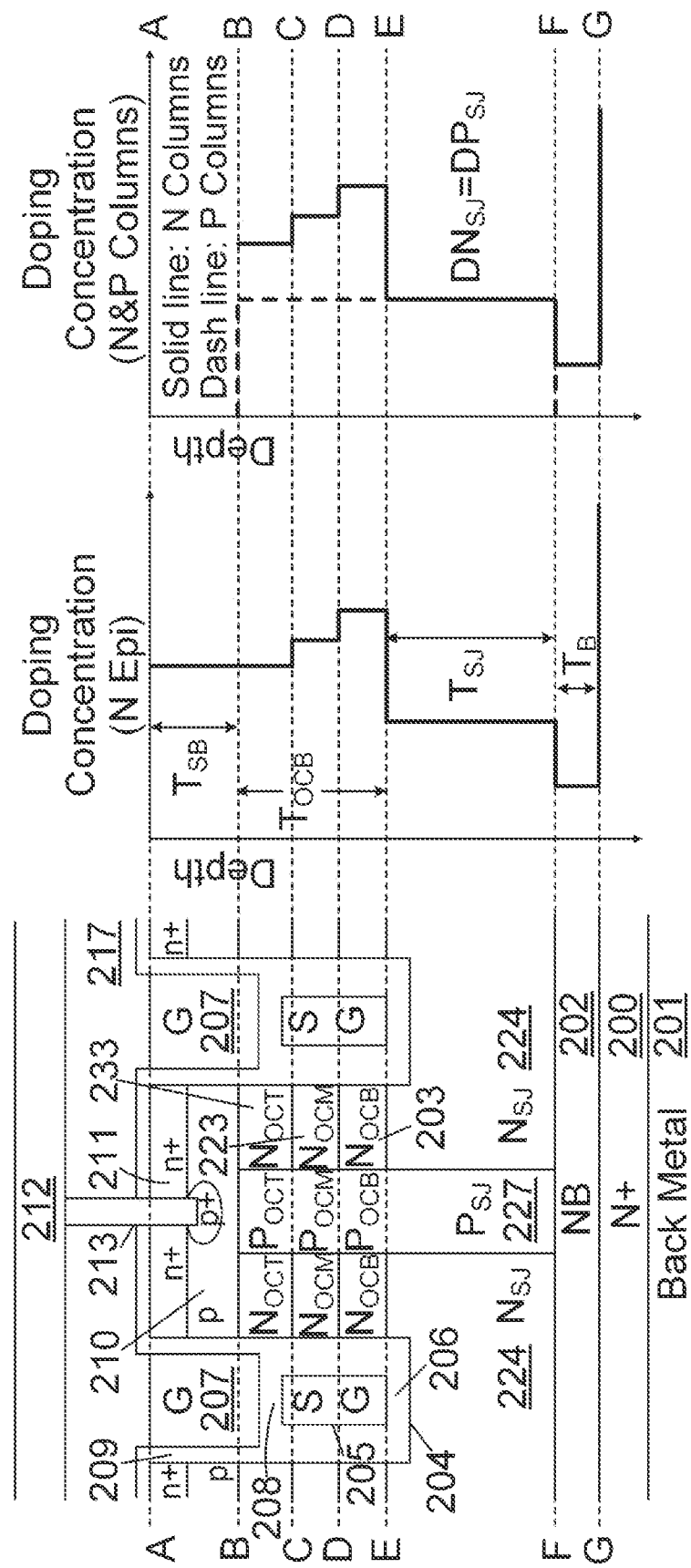
FIG. 2A is a cross-sectional view of another preferred embodiment wherein doping concentration variations of the N type epitaxial layer, the N& P columns are depicted along the vertical direction according to the present invention.

Please refer to FIG. 2A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 1A, except that, in FIG. 2A, the N type epitaxial layer in the OCB region $T_{OCB}$ (between B-B and E-E lines) comprises three stepped epitaxial layers of different doping concentrations including a bottom $1^{st}$ epitaxial layer ($N_{OCB}$, as illustrated between D-D and E-E lines) 203 with a doping concentration D1, a middle $2^{nd}$ epitaxial layer ($N_{OCM}$, as illustrated between C-C and D-D lines) 223 with a doping concentration D2 and a top $3^{rd}$ epitaxial layer ($N_{OCT}$, as illustrated between B-B and C-C lines) 233 with a doping concentration D3, wherein D3<D2<D1, to further reduce the specific on-resistance. The D2 can be an average of D1 and D3. The epitaxial layer in the source and body regions $T_{SB}$ has a doping concentration same as the top $3^{rd}$ epitaxial layer 233 in the OCB region, which is higher than the doping concentration $DN_{SJ}$ of the single epitaxial layer and N type doped columns ($N_{SJ}$, as illustrated) 224 in the SJ region. Moreover, all the P type doped columns, including $P_{OCT}$, $P_{OCM}$ and $P_{OCB}$ in the OCB region and $P_{SJ}$ in the SJ region have the same doping concentration $DP_{SJ}$, which is same as the doping concentration $DN_{SJ}$ of the single epitaxial layer and N type doped columns 224 in the SJ region and lower than the doping concentration D3 of the top $3^{rd}$ epitaxial layer 233 in the OCB region.

Figure 2B:
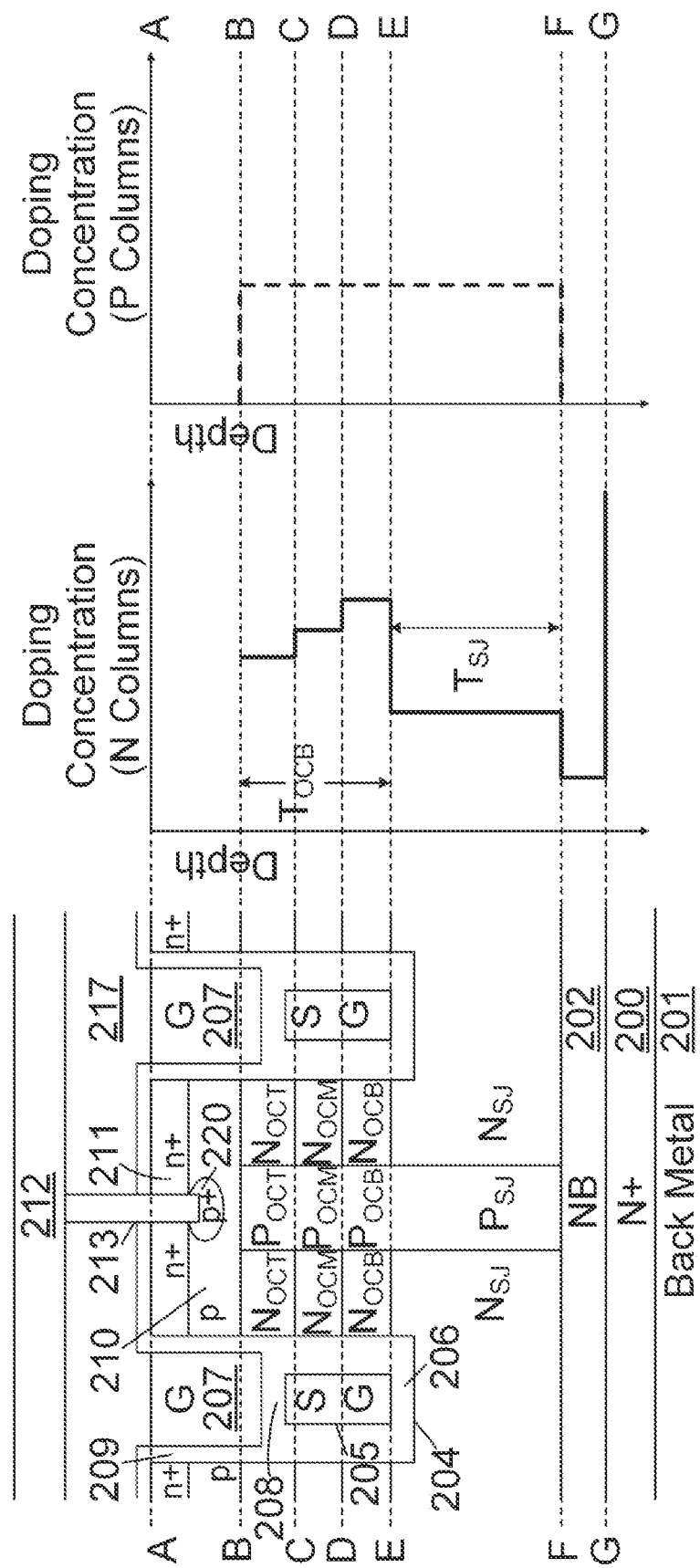
FIG. 2B is the cross-sectional view of the preferred embodiment shown in FIG. 2A, wherein doping concentration variations of the N columns and P columns are depicted separately along the vertical direction according to the present invention.

Please refer to FIG. 2B for the same preferred embodiment of the present invention shown in FIG. 2A, wherein doping concentration variations of the N columns and P columns are depicted separately along the vertical direction according to the present invention.

Figure 3A:
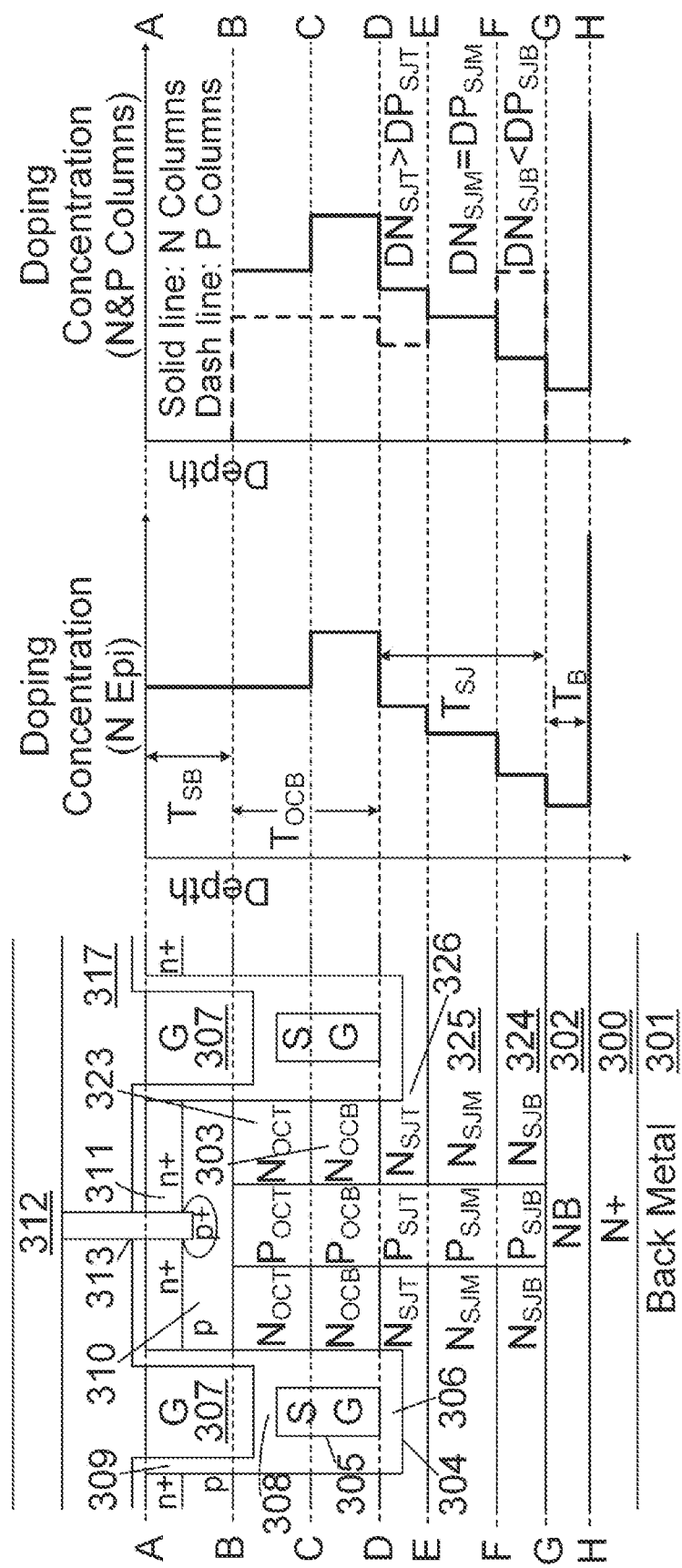
FIG. 3A is a cross-sectional view of another preferred embodiment wherein doping concentration variations of the N type epitaxial layer, the N& P columns are depicted along the vertical direction according to the present invention.

Please refer to FIG. 3A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 1A, except that, in FIG. 3A, the SJ region $T_{SJ}$ (between D-D and G-G lines) has N type MSE layers with doping concentrations increasing stepwise in a direction from the buffer region 302 toward a bottom of the OCB region. The N type MSE layers and the N type doped columns have three different doping concentrations, including a bottom $1^{st}$ epitaxial layer and $1^{st}$ N type doped columns ($N_{SJB}$, as illustrated between F-F and G-G lines) 324 with a doping concentration $DN_{SJB}$, a middle $2^{nd}$ epitaxial layer and $2^{nd}$ type doped columns ($N_{SJM}$, as illustrated between E-E and F-F lines) 325 with a doping concentration $DN_{SJM}$ and a top $3^{rd}$ epitaxial layer and $3^{rd}$ N type doped columns ($N_{SJT}$, as illustrated between D-D and E-E lines) 326 with a doping concentration $DN_{SJT}$, wherein $DN_{SJB}<DN_{SJM}<DN_{SJT}$. The doping concentration $DN_{SJT}$ of the top $3^{rd}$ epitaxial layer and $3^{rd}$ N type doped columns 326 is lower than the doping concentration D2 of the top $2^{nd}$ epitaxial layer ($N_{OCT}$, as illustrated between B-B and C-C lines) 323 in the OCB region. Meanwhile, the doping concentrations of the P type doped columns in the SJ region decrease stepwise in a direction from the buffer region 302 toward a bottom of the OCB region, the doping concentration DPs of the $1^{st}$ bottom P type doped columns ($P_{SJB}$, as illustrated between F-F and G-G lines) is higher than the doping concentration $DP_{SJM}$ of the $2^{nd}$ P type doped columns ($P_{SJM}$, as illustrated between E-E and F-F lines), and $DP_{SJM}$ is higher than the doping concentration $DP_{SJT}$ of the $3^{rd}$ P type doped columns ($P_{SJT}$, as illustrated between D-D and E-E lines), that is $DP_{SJB}>DP_{SJM}>DP_{SJT}$. Moreover, the doping concentration $DN_{SJB}$ of the bottom $1^{st}$ epitaxial layer and $1^{st}$ N type doped columns 324 is lower than the doping concentration $DP_{SJB}$ of the $1^{st}$ P type doped columns $P_{SJB}$ at a bottom of the SJ region near the buffer region 302 ($DN_{SJB}<DP_{SJB}$); the doping concentration $DN_{SJM}$ of the middle $2^{nd}$ epitaxial layer and $2^{nd}$ N type doped columns 325 is the same as the doping concentration $DP_{SJB}$ of the $2^{nd}$ P type doped columns $P_{SJB}$ at a middle of the SJ region ($DN_{SJM}=DP_{SJB}$); the doping concentration $DN_{SJT}$ of the top $3^{rd}$ epitaxial layer and the $3^{rd}$ N type doped columns 326 is higher than the doping concentration $DP_{SJT}$ of the $3^{rd}$ P type doped columns $P_{SJT}$ at a top of the SJ region near the OCB region ($DN_{SJT}>DP_{SJT}$). Moreover, all the P type doped columns $P_{OCT}$ and $P_{OCB}$ in the OCB region have the same doping concentration $DP_{OC}$, which is also the same as the doping concentration $DP_{SJM}$ of the $2^{nd}$ P type doped columns $P_{SJM}$ in a middle of the SJ region.

Figure 3B:
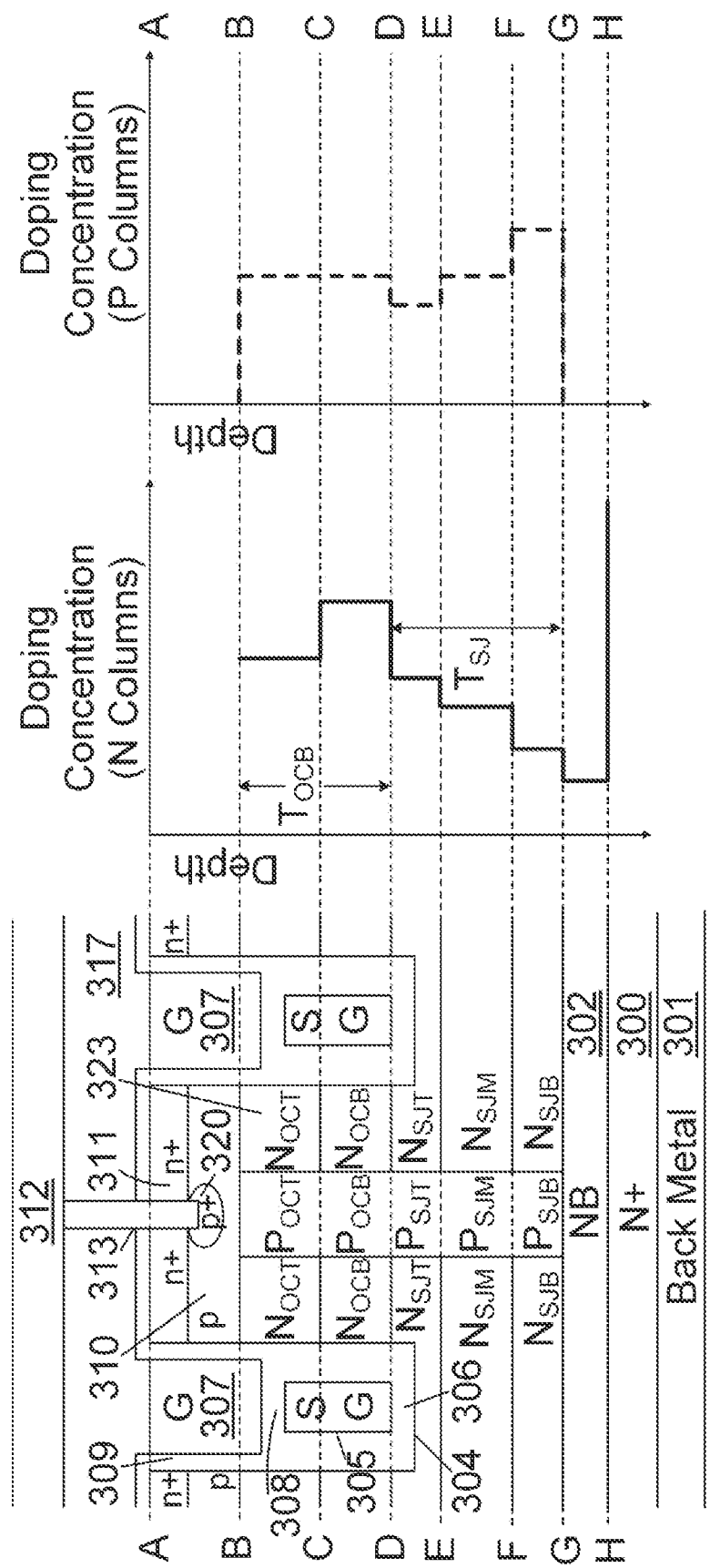
FIG. 3B is the cross-sectional view of the preferred embodiment shown in FIG. 3A, wherein doping concentration variations of the N columns and P columns are depicted separately along the vertical direction according to the present invention.

Please refer to FIG. 3B for the same preferred embodiment of the present invention shown in FIG. 3A, wherein doping concentration variations of the N columns and P columns are depicted separately along the vertical direction according to the present invention.

Figure 3C:
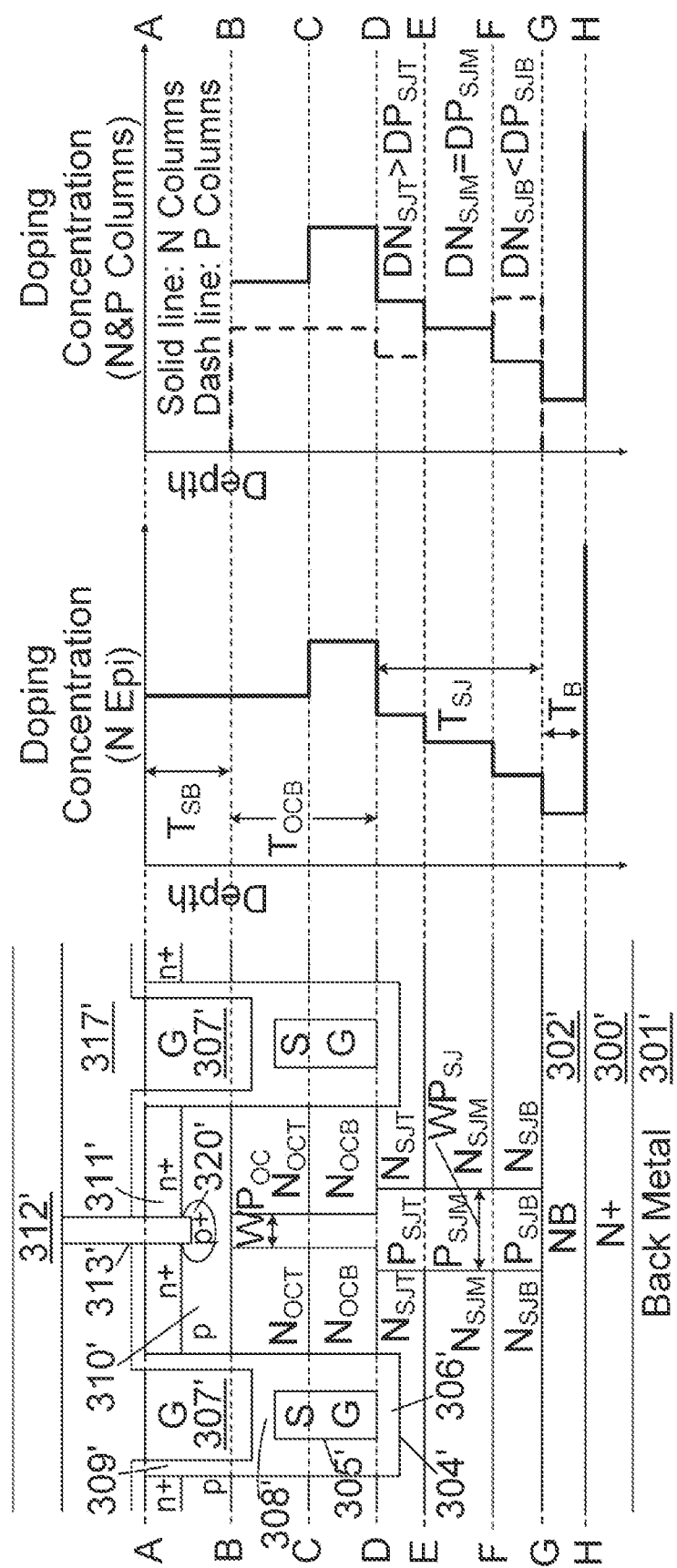
FIG. 3C is a cross-sectional view of another preferred embodiment wherein doping concentration variations of the N type epitaxial layer, the N& P columns are depicted along the vertical direction according to the present invention.

Please refer to FIG. 3C for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A, except that, in FIG. 3C, widths of the P type doped columns in the OCB region ($WP_{OC}$) are narrower than widths of the P type doped columns $P_{SJT}$, $P_{SJM}$ and $P_{SJB}$ in the SJ region ($WP_{SJ}$), that is $WP_{OC} < WP_{SJ}$.

Figure 3D:
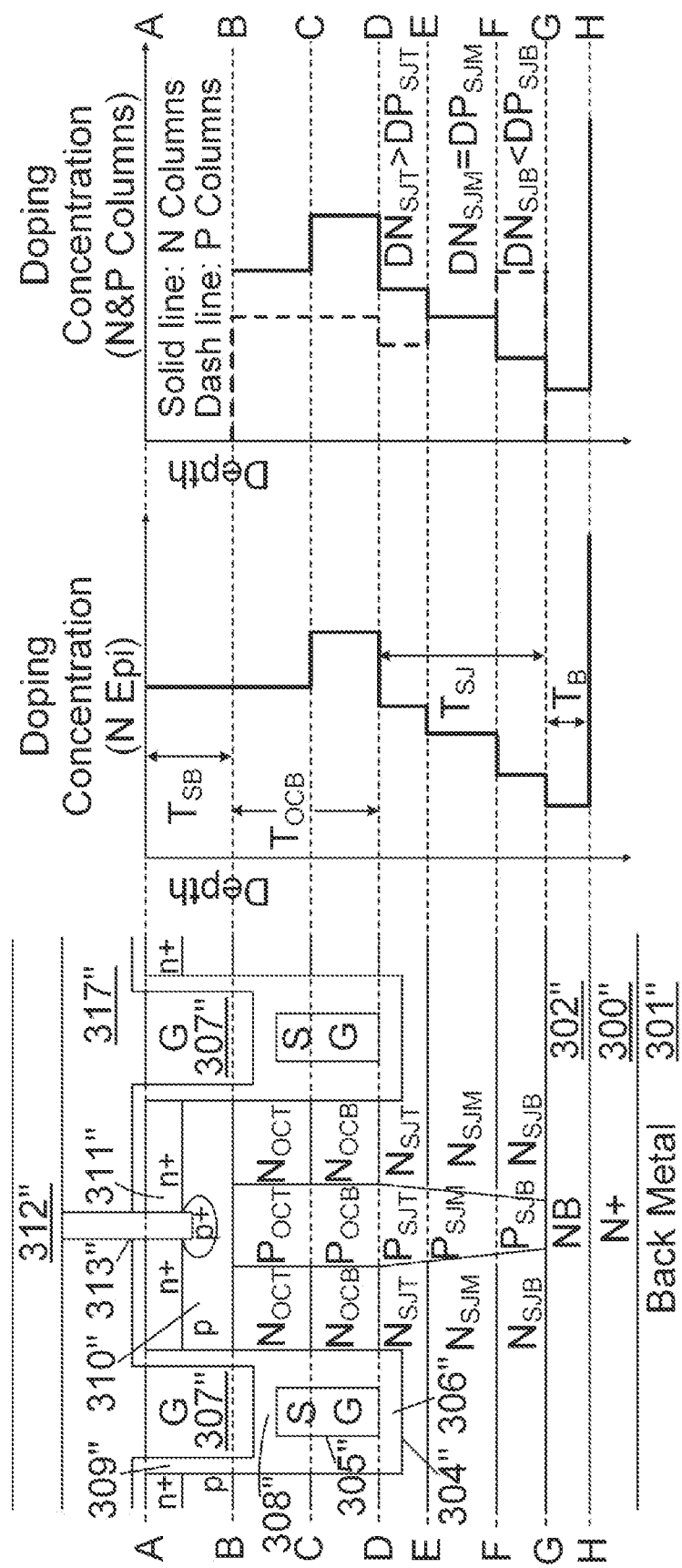
FIG. 3D is a cross-sectional view of another preferred embodiment wherein doping concentration variations of the N type epitaxial layer, the N& P columns are depicted along the vertical direction according to the present invention.

Please refer to FIG. 3D for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A with the same doping concentrations of the N type epitaxial layer and the N& P columns in FIG. 3A, except that, in FIG. 3D, the P type doped columns in the SJ region have a sloped shape, and widths of the P type doped columns in the SJ region decrease linearly from a bottom of the OCB region toward the buffer region 302".

Figure 4A:
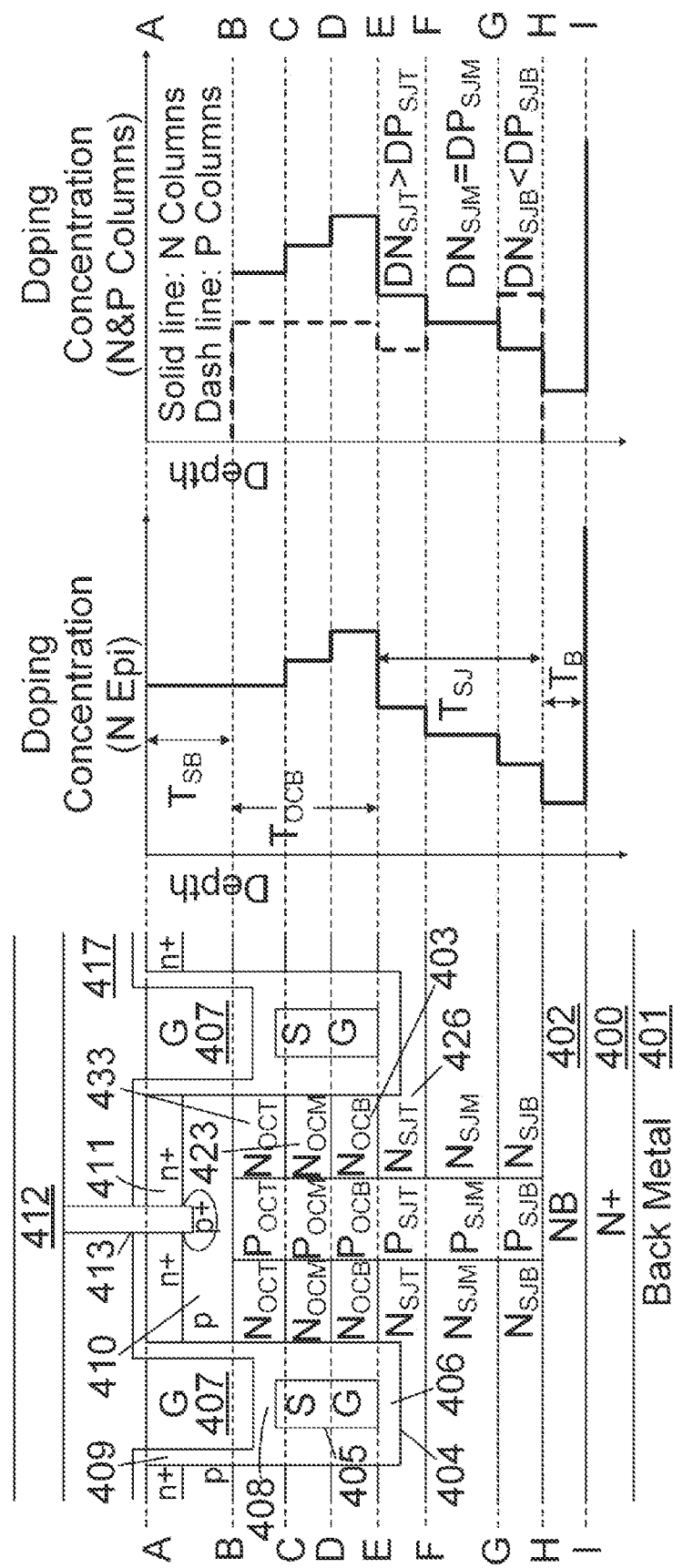
FIG. 4A is a cross-sectional view of another preferred embodiment wherein doping concentration variations of the N type epitaxial layer, the N& P columns are depicted along the vertical direction according to the present invention.

Please refer to FIG. 4A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A, except that, in FIG. 4A, the N type epitaxial layer in the OCB region $T_{OCB}$ (between B-B and E-E lines) comprises three stepped epitaxial layers of different doping concentrations including a bottom $1^{st}$ epitaxial layer ($N_{OCB}$, as illustrated between D-D and E-E lines) 403 with a doping concentration D1, a middle $2^{nd}$ epitaxial layer ($N_{OCM}$, as illustrated between C-C and D-D lines) 423 with a doping concentration D2 and a top $3^{rd}$ epitaxial layer ($N_{OCT}$, as illustrated between B-B and C-C lines) 433 with a doping concentration D3, wherein D3<D2<D1, to further reduce the specific on-resistance. The D2 can be an average of D1 and D3. The epitaxial layer in the source and body regions $T_{SB}$ has a doping concentration same as the top $3^{rd}$ epitaxial layer 433 in the OCB region, which is higher than the doping concentration $DN_{SJT}$ of the top $3^{rd}$ epitaxial layer and $3^{rd}$ N type doped columns ($N_{SJ}$, as illustrated) 426 in the SJ region. Moreover, all the P type doped columns $P_{OCT}$, $P_{OCM}$ and $P_{OCB}$ in the OCB region have the same doping concentration $DP_{OC}$, which is also the same as the doping concentration $DP_{SJM}$ of the $2^{nd}$ P type doped columns $P_{SJM}$ in a middle of the SJ region.

Figure 4B:
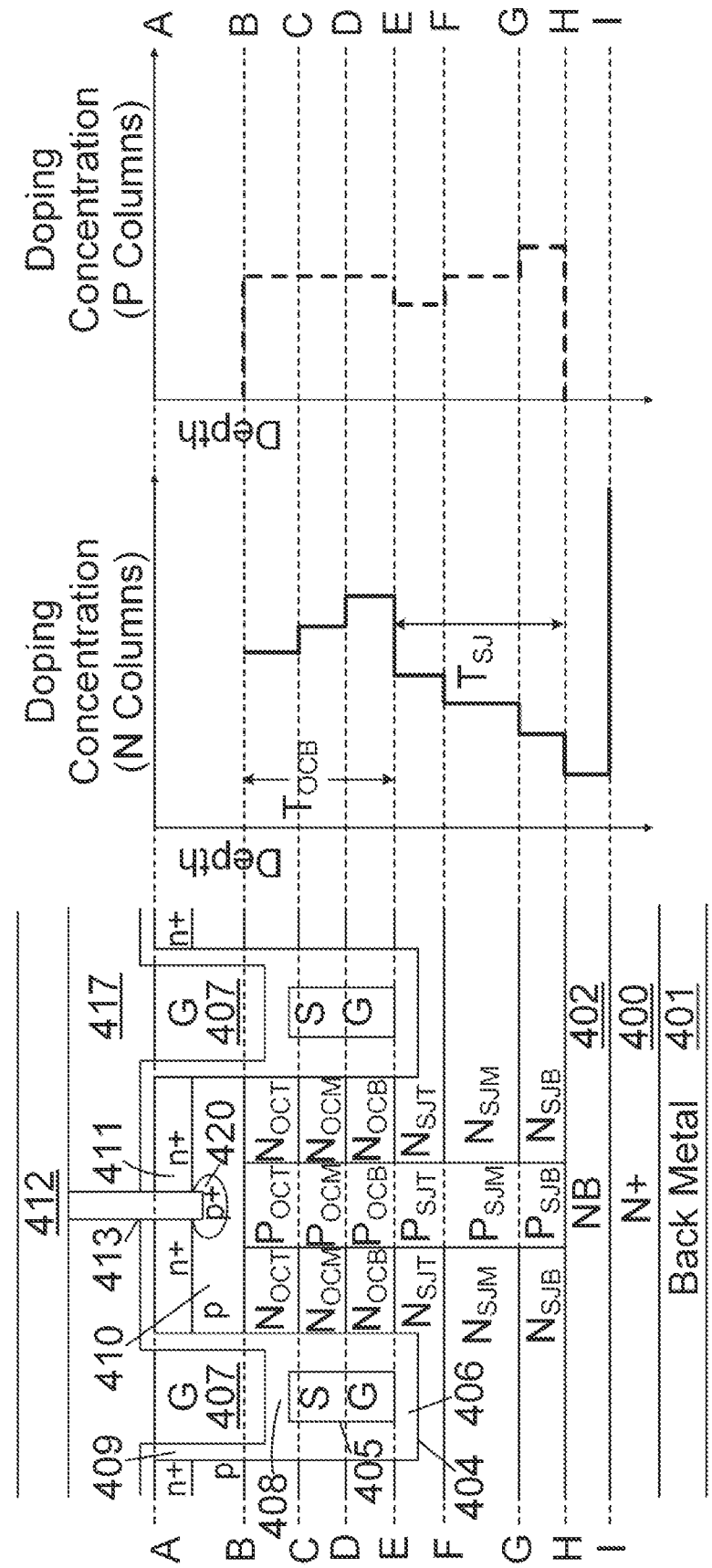
FIG. 4B is the cross-sectional view of the preferred embodiment shown in FIG. 4A, wherein doping concentration variations of the N columns and P columns are depicted separately along the vertical direction according to the present invention.

Please refer to FIG. 4B for the same preferred embodiment of the present invention shown in FIG. 4A, wherein doping concentration variations of the N columns and P columns are depicted separately along the vertical direction according to the present invention.

Figure 5A:
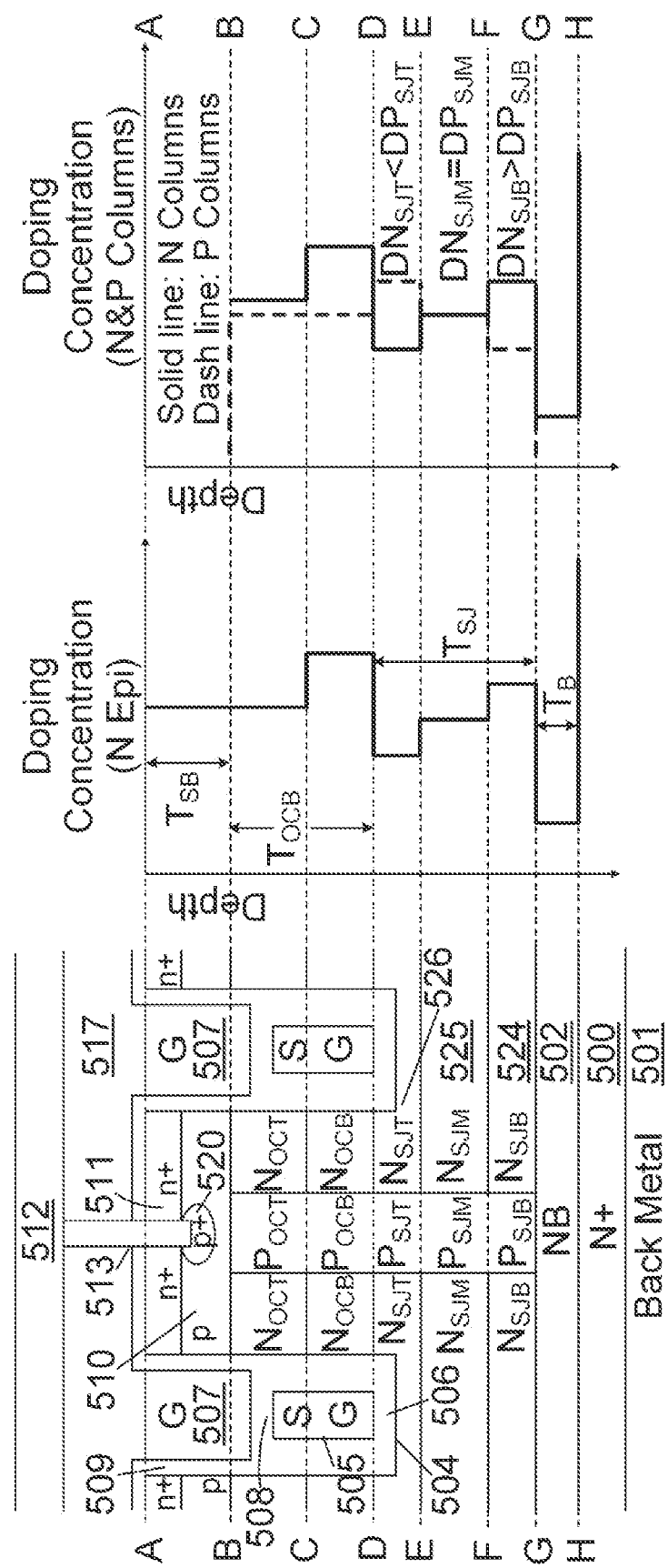
FIG. 5A is a cross-sectional view of another preferred embodiment wherein doping concentration variations of the N type epitaxial layer, the N& P columns are depicted along the vertical direction according to the present invention.

Please refer to FIG. 5A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A, except for the different N type MSE layers and P type doped columns with reverse doping concentration variations in the SJ region. The N type MSE layers in the SJ region have doping concentrations decreasing stepwise in a direction from the buffer region 502 toward a bottom of the OCB region. In FIG. 5A, the SJ region $T_{SJ}$ between the OCB region $T_{OCB}$ and the buffer region 502 has N type MSE layers and N type doped columns with three different doping concentrations, including a bottom $1^{st}$ epitaxial layer and $1^{st}$ N type doped columns ($N_{SJB}$, as illustrated between F-F and G-G lines) 524 with a doping concentration $DN_{SJB}$, a middle $2^{nd}$ epitaxial layer and $2^{nd}$ N type doped columns ($N_{SJM}$, as illustrated between E-E and F-F lines) 525 with a doping concentration $DN_{SJ}$ and a top $3^{rd}$ epitaxial layer and $3^{rd}$ N type doped columns ($N_{SJT}$, as illustrated between D-D and E-E lines) 526 with a doping concentration $DN_{SJT}$, wherein $DN_{SJB} > DN_{SJM} > DN_{SFT}$. Meanwhile, the doping concentrations of the P type doped columns in the SJ region increase stepwise in a direction from the buffer region 502 toward a bottom of the OCB region, the doping concentration $DP_{SJM}$ of the $1^{st}$ bottom P type doped columns ($P_{SJB}$, as illustrated between F-F and G-G lines) is lower than the doping concentration $DP_{SJM}$ of the $2^{nd}$ P type doped columns ($P_{SJM}$, as illustrated between E-E and F-F lines), and $DP_{SJM}$ is lower than the doping concentration $DP_{SJT}$ of $3^{rd}$ P type doped columns ($P_{SJT}$, as illustrated between D-D and E-E lines), that is $DP_{SJB} < DP_{SJM} < DP_{SJT}$. Moreover, the doping concentration $DN_{SJB}$ of the bottom $1^{st}$ epitaxial layer and $1^{st}$ N type doped columns 524 is higher than the doping concentration $DP_{SJB}$ of the $1^{st}$ P type doped columns ($P_{SJB}$, as illustrated between F-F and G-G lines) at a bottom of the SJ region near the buffer region 502 ($DN_{SJB} > DP_{SJB}$); the doping concentration $DN_{SJB}$ of the middle $2^{nd}$ epitaxial layer and $2^{nd}$ N type doped columns 525 is the same as the doping concentration $DP_{SJM}$ of the $2^{nd}$ P type doped columns ($P_{SJM}$, as illustrated between E-E and F-F lines) at a middle of the SJ region ($DN_{SJM} = DP_{SJM}$); the doping concentration $DN_{SJT}$ of the top $3^{rd}$ epitaxial layer and $3^{rd}$ N type doped columns 526 is lower than doping concentration $DP_{SJM}$ of the $3^{rd}$ P type doped columns ($P_{SJT}$, as illustrated between D-D and E-E lines) at a top of the SJ region near the OCB region ($DN_{SJT} < DP_{SJT}$). Moreover, the doping concentrations $DP_{OCT}$ and $DP_{OCB}$ of the P type doped columns $P_{OCT}$ and $P_{OCB}$ in the OCB region are the same, which is also same as the doping concentration $DP_{SJM}$ of the $2^{nd}$ P type doped columns ($P_{SJM}$, as illustrated between E-E and F-F lines) in the SJ region.

Figure 5B:
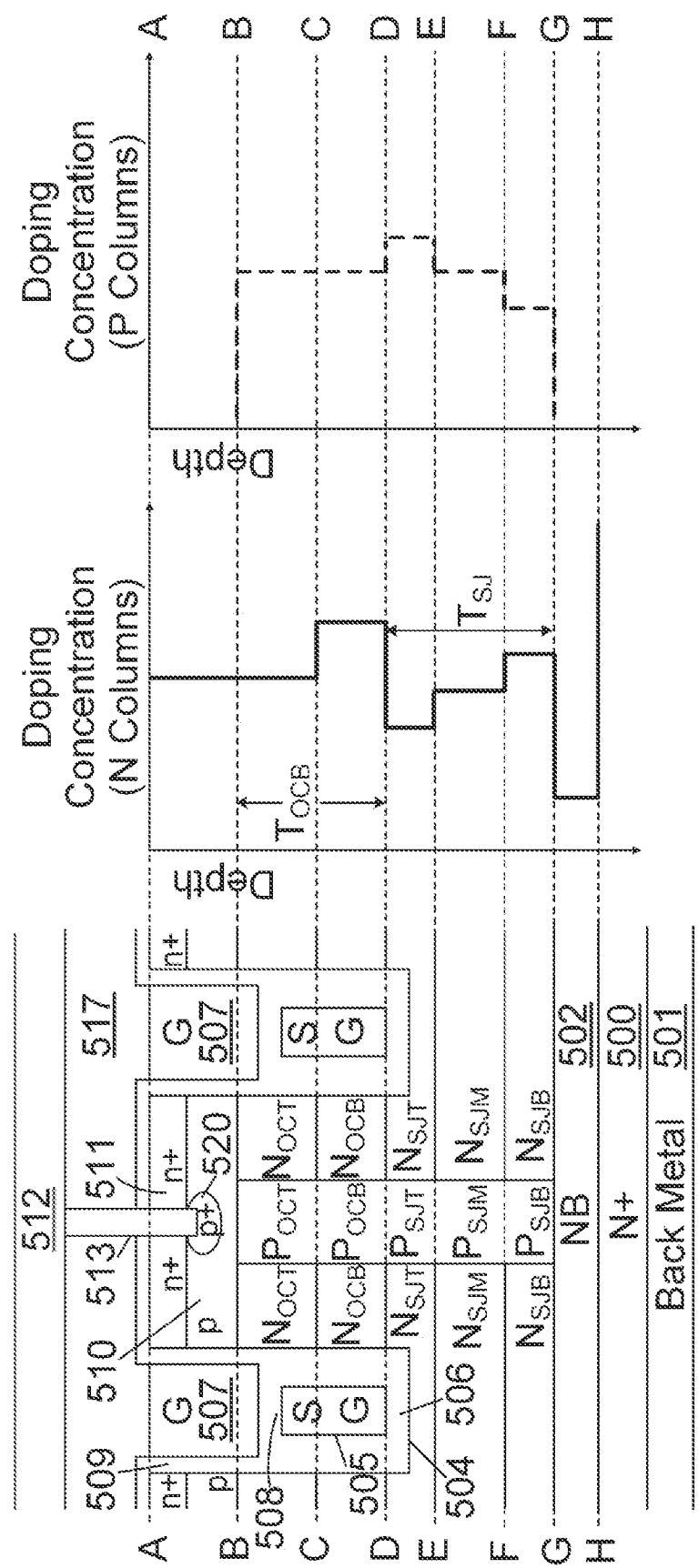
FIG. 5B is the cross-sectional view of the preferred embodiment shown in FIG. 5A, wherein doping concentration variations of the N columns and P columns are depicted separately along the vertical direction according to the present invention.

Please refer to FIG. 5B for the same preferred embodiment of the present invention shown in FIG. 5A, wherein doping concentration variations of the N columns and P columns are depicted separately along the vertical direction according to the present invention.

Figure 6A:
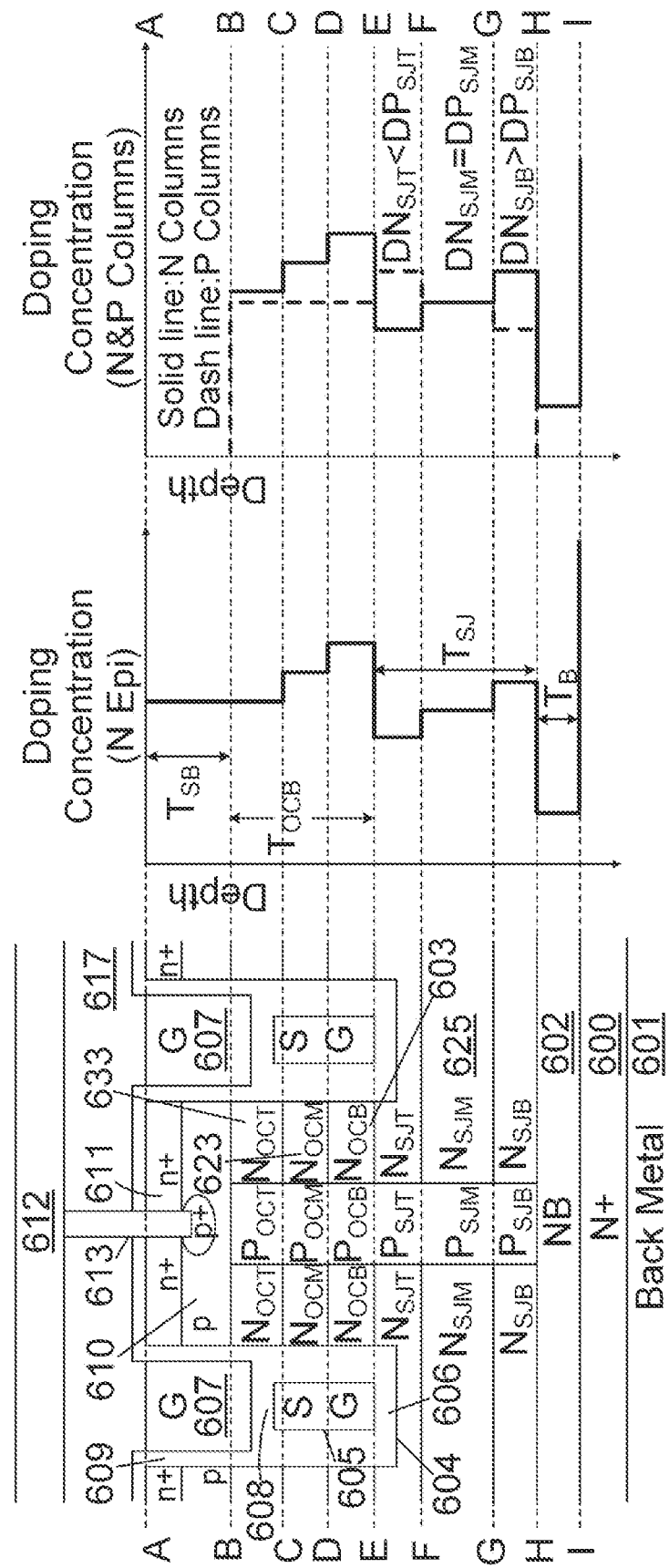
FIG. 6A is a cross-sectional view of another preferred embodiment wherein doping concentration variations of the N type epitaxial layer, the N& P columns are depicted along the vertical direction according to the present invention.

Please refer to FIG. 6A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 5A, except that, in FIG. 6A, the N type epitaxial layer in the OCB region $T_{OCB}$ (between B-B and E-E lines) comprises three stepped epitaxial layers of different doping concentrations including a bottom $1^{st}$ epitaxial layer ($N_{OCB}$, as illustrated between D-D and E-E lines) 603 with a doping concentration D1, a middle $2^{nd}$ epitaxial layer ($N_{OCM}$, as illustrated between C-C and D-D lines) 623 with a doping concentration D2 and a top $3^{nd}$ epitaxial layer ($N_{OCT}$, as illustrated between B-B and C-C lines) 633 with a doping concentration D3, wherein D3<D2<D1, to further reduce the specific on-resistance. The D2 can be an average of D1 and D3. The epitaxial layer in the source and body regions $T_{SB}$ has a doping concentration same as the top $3^{rd}$ epitaxial layer 633 in the OCB region, which is higher than the doping concentration $DN_{SJM}$ of the middle $2^{nd}$ epitaxial layer and $2^{nd}$ N type doped columns ($N_{SJM}$, as illustrated) 625 in the SJ region. Moreover, all the P type doped columns $P_{OCT}$, $P_{OCM}$ and $P_{OCB}$ in the OCB region have the same doping concentration $DP_{OC}$, which is also the same as the doping concentration $DP_{SJM}$ of the $2^{nd}$ P type doped columns $P_{SJM}$ in a middle of the SJ region.

Figure 6B:
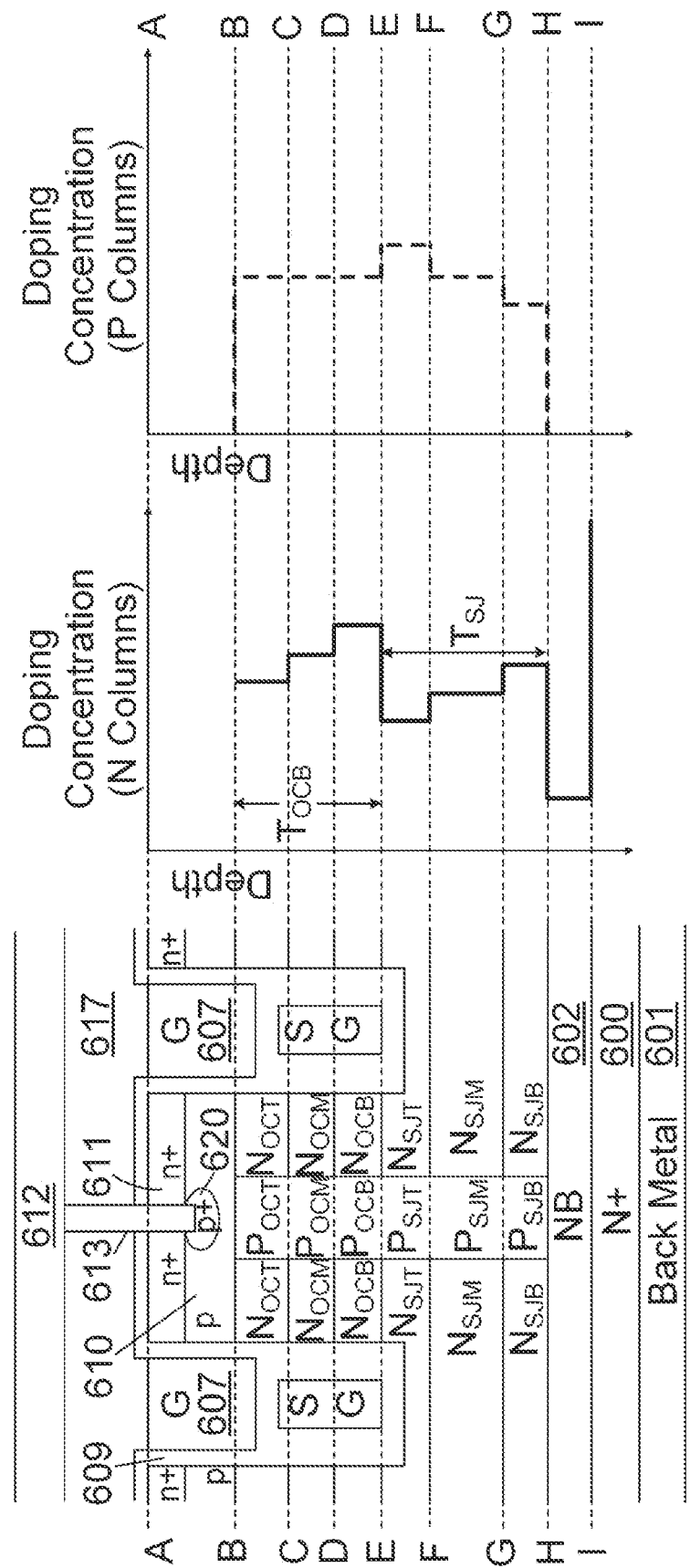
FIG. 6B is the cross-sectional view of the preferred embodiment shown in FIG. 6A, wherein doping concentration variations of the N columns and P columns are depicted separately along the vertical direction according to the present invention.

Please refer to FIG. 6B for the same preferred embodiment of the present invention shown in FIG. 6A, wherein doping concentration variations of the N columns and P columns are depicted separately along the vertical direction according to the present invention.

Figure 7A:
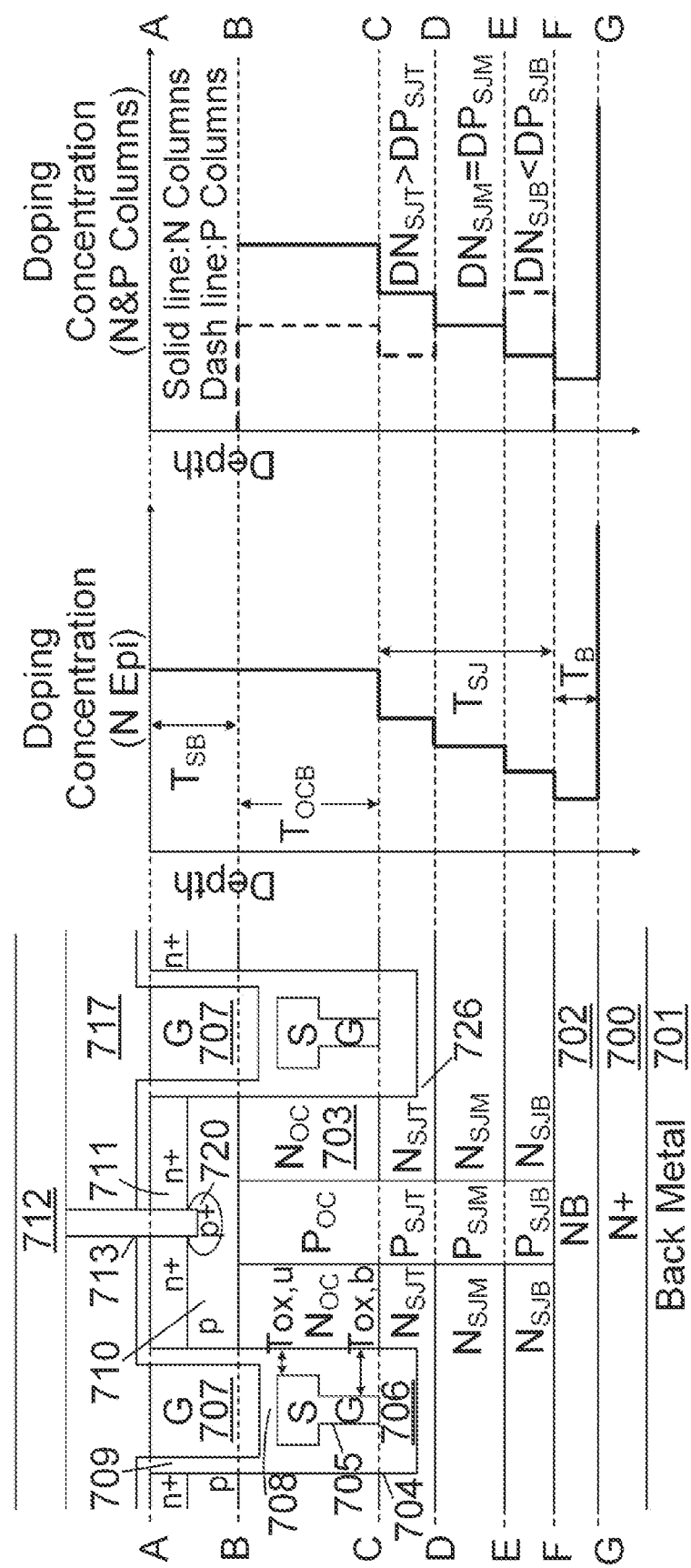
FIG. 7A is a cross-sectional view of another preferred embodiment wherein doping concentration variations of the N type epitaxial layer, the N& P columns are depicted along the vertical direction according to the present invention.

Please refer to FIG. 7A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A, except for the different epitaxial layer and the different first insulating film 706 in the OCB region $T_{OCB}$. In the present invention, the epitaxial layer in the OCB region $T_{OCB}$ is a single epitaxial layer ($N_{OC}$, as illustrated between B-B and C-C lines) 703 with a uniform doping concentration D1, which is higher than the top $3^{rd}$ epitaxial layer and $3^{rd}$ N type doped columns ($N_{SJT}$, as illustrated between C-C and D-D lines) 726 with a doping concentration $DN_{SJT}$. The epitaxial layer in the source and body regions $T_{SB}$ has a doping concentration $D_B$ same as the single epitaxial layer in the OCB region. Besides, the first insulating film 706 in a single trench 704 has two stepped oxide structure having a lower portion oxide along lower portion sidewalls and bottoms of the gate trenches 704 with a uniform first thickness Tox,b along trench sidewalls, and an upper portion oxide with a uniform second thickness Tox,u, where Tox,b is greater than Tox,u, to further reduce the on-resistance while maintaining the same breakdown voltage.

Figure 7B:
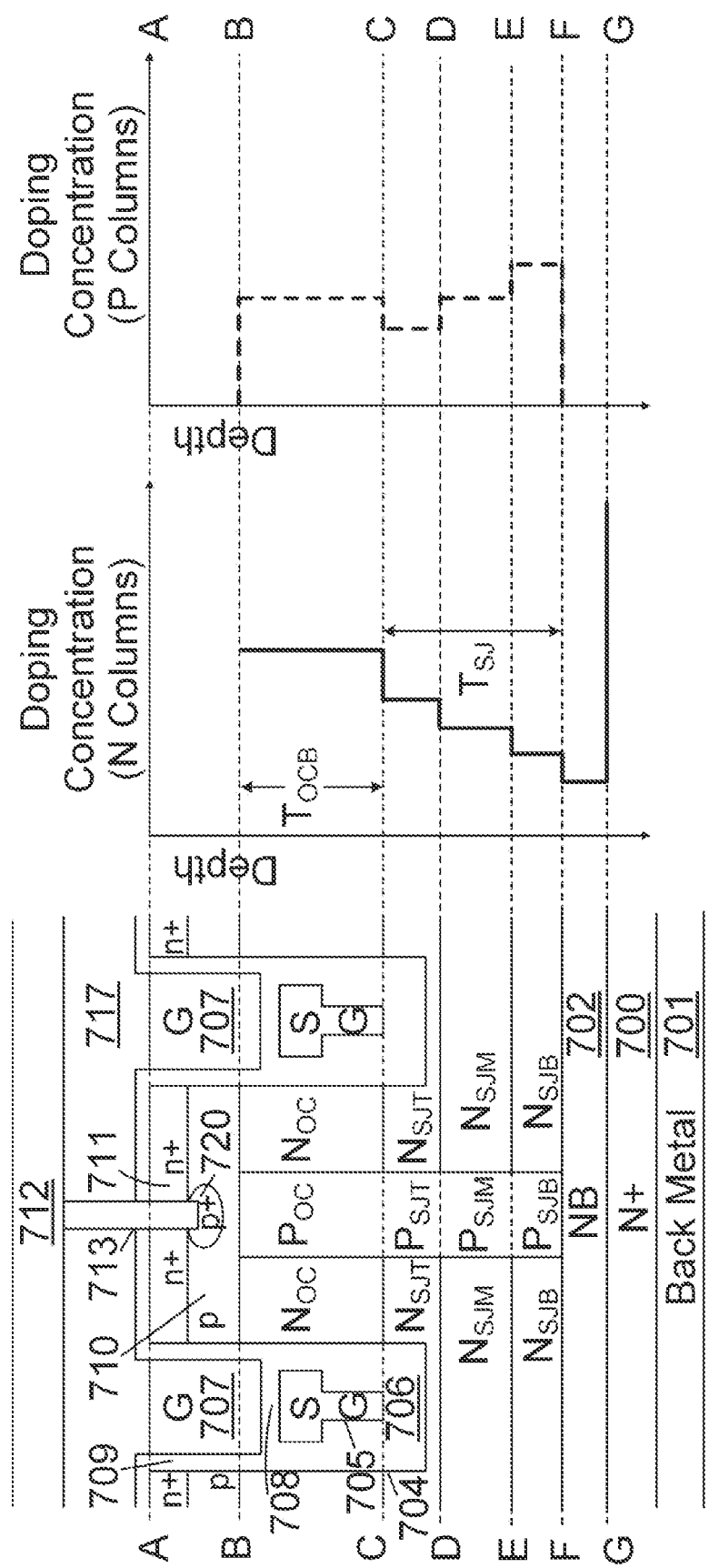
FIG. 7B is the cross-sectional view of the preferred embodiment shown in FIG. 7A, wherein doping concentration variations of the N columns and P columns are depicted separately along the vertical direction according to the present invention.

Please refer to FIG. 7B for the same preferred embodiment of the present invention shown in FIG. 7A, wherein doping concentration variations of the N columns and P columns are depicted separately along the vertical direction according to the present invention.

Figure 8A:
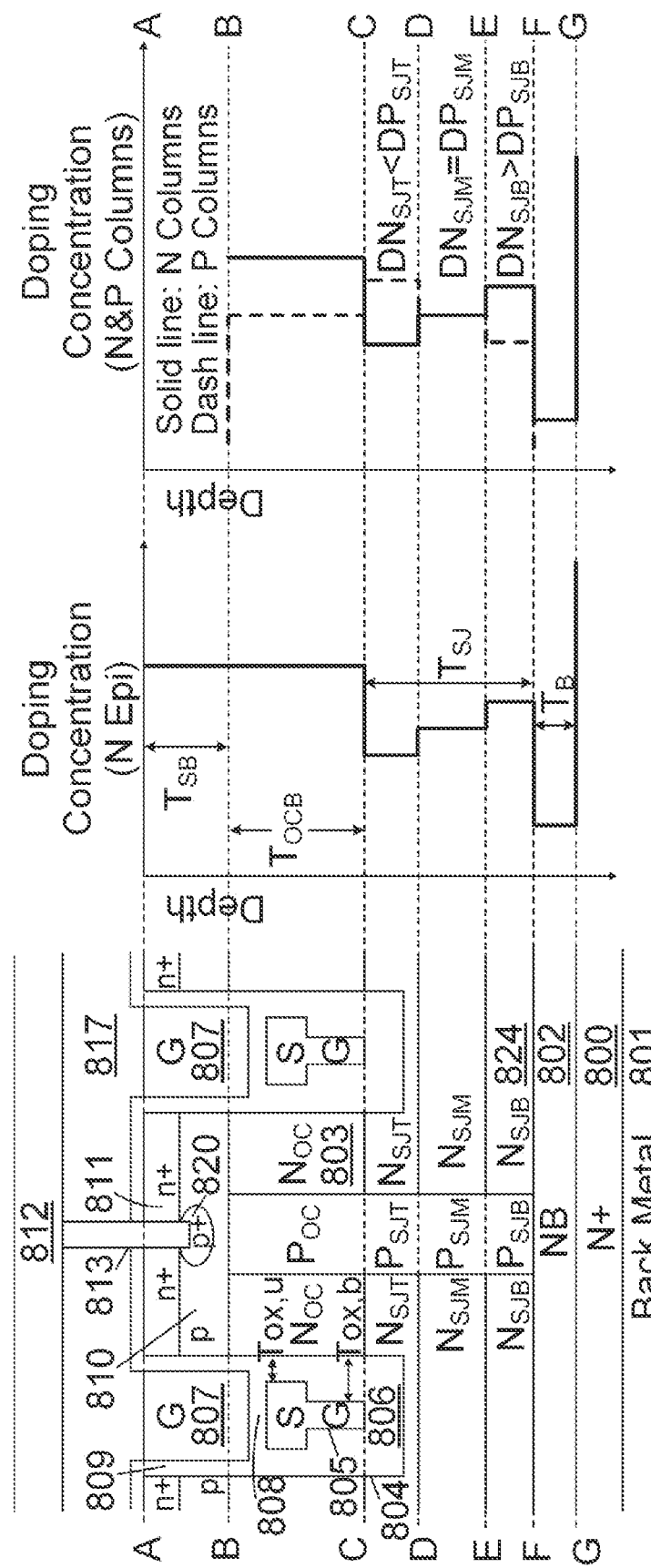
FIG. 8A is a cross-sectional view of another preferred embodiment wherein doping concentration variations of the N type epitaxial layer, the N& P columns are depicted along the vertical direction according to the present invention.

Please refer to FIG. 8A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 5A, except for the different epitaxial layer and the different first insulating film 806 in the OCB region $T_{OCB}$. In the present invention, the epitaxial layer in the OCB region $T_{OCB}$ is a single epitaxial layer ($N_{OC}$, as illustrated between B-B and C-C lines) 803 with a uniform doping concentration D1, which is higher than the bottom $1^{st}$ epitaxial layer and $1^{st}$ N type doped columns ($N_{SJB}$, as illustrated between E-E and F-F lines) 824 with a doping concentration $DN_{SJB}$. The epitaxial layer in the source and body regions $T_{SB}$ has a doping concentration $D_B$ same as the single epitaxial layer 803 in the OCB region. Besides, the first insulating film 806 in a single trench 804 has two stepped oxide structure having a lower portion oxide along lower portion sidewalls and bottoms of the gate trenches 804 with a uniform first thickness Tox,b along trench sidewalls, and an upper portion oxide with a uniform second thickness Tox,u, where Tox,b is greater than Tox,u, to further reduce the on-resistance while maintaining the same breakdown voltage.

Figure 8B:
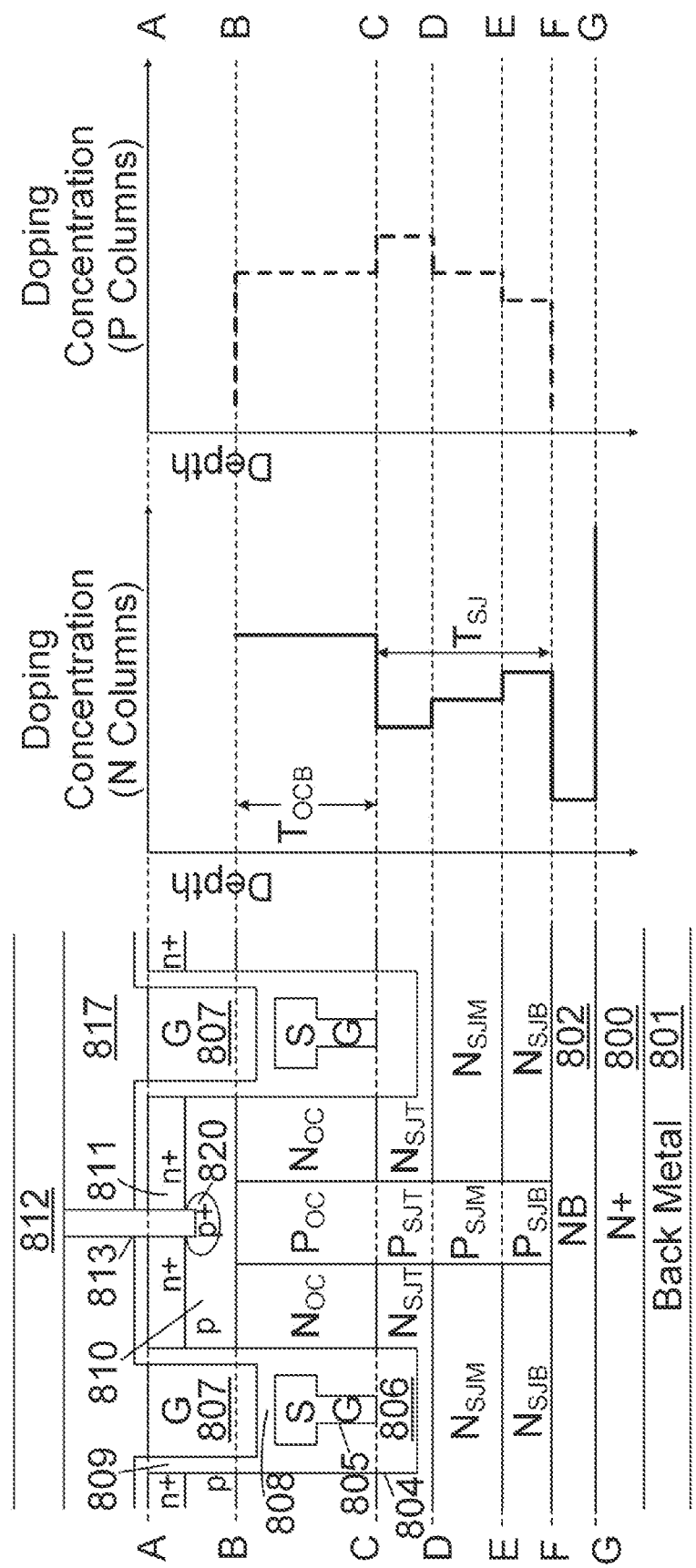
FIG. 8B is the cross-sectional view of the preferred embodiment shown in FIG. 8A, wherein doping concentration variations of the N columns and P columns are depicted separately along the vertical direction according to the present invention.

Please refer to FIG. 8B for the same preferred embodiment of the present invention shown in FIG. 8A, wherein doping concentration variations of the N columns and P columns are depicted separately along the vertical direction according to the present invention.

Figure 9A:
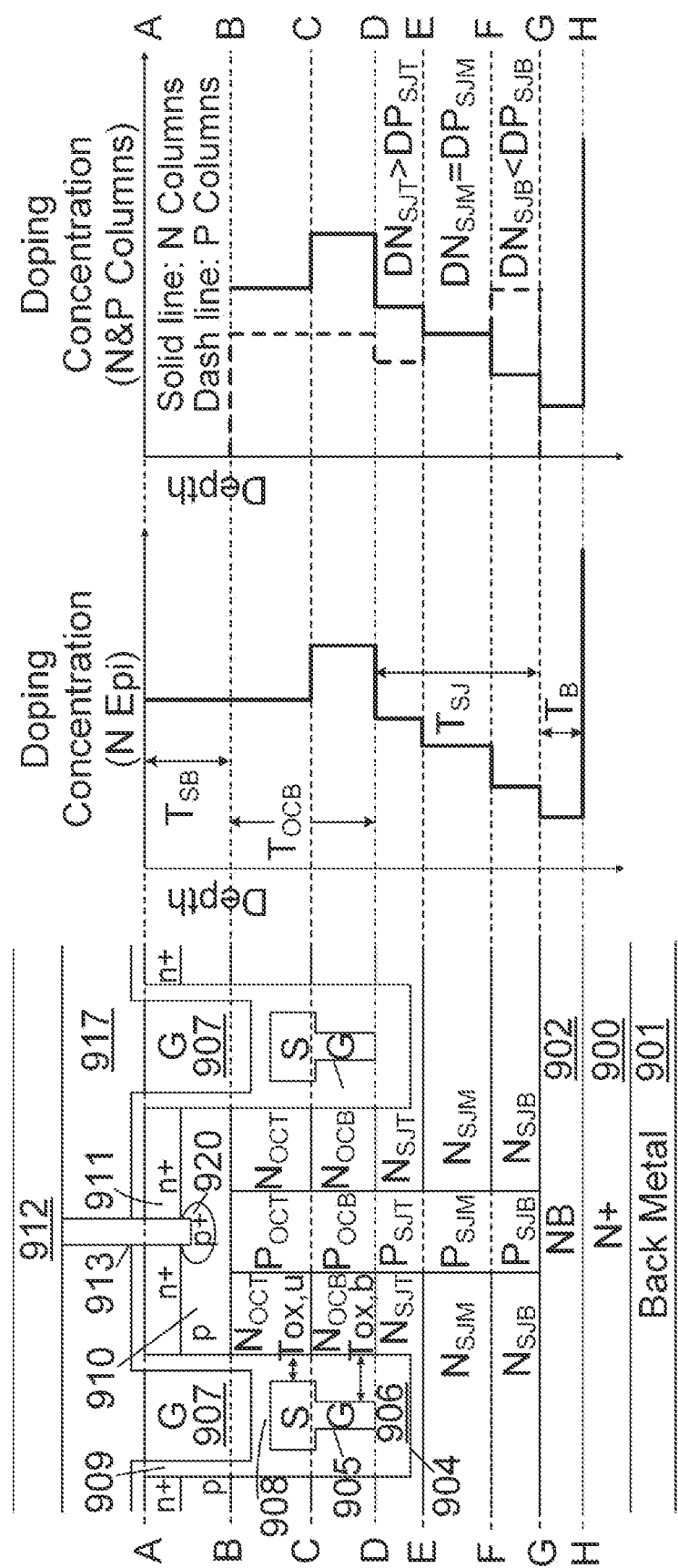
FIG. 9A is a cross-sectional view of another preferred embodiment wherein doping concentration variations of the N type epitaxial layer, the N& P columns are depicted along the vertical direction according to the present invention.

Please refer to FIG. 9A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 3A, except for the different first insulating film 906. In the present invention, the first insulating film 906 in a single trench 904 has two stepped oxide structure having a lower portion oxide along lower portion sidewalls and bottoms of the gate trenches 904 with a uniform first thickness Tox,b along trench sidewalls, and an upper portion oxide with a uniform second thickness Tox,u, where Tox,b is greater than Tox,u, to further reduce the on-resistance while maintaining the same breakdown voltage.

Figure 9B:
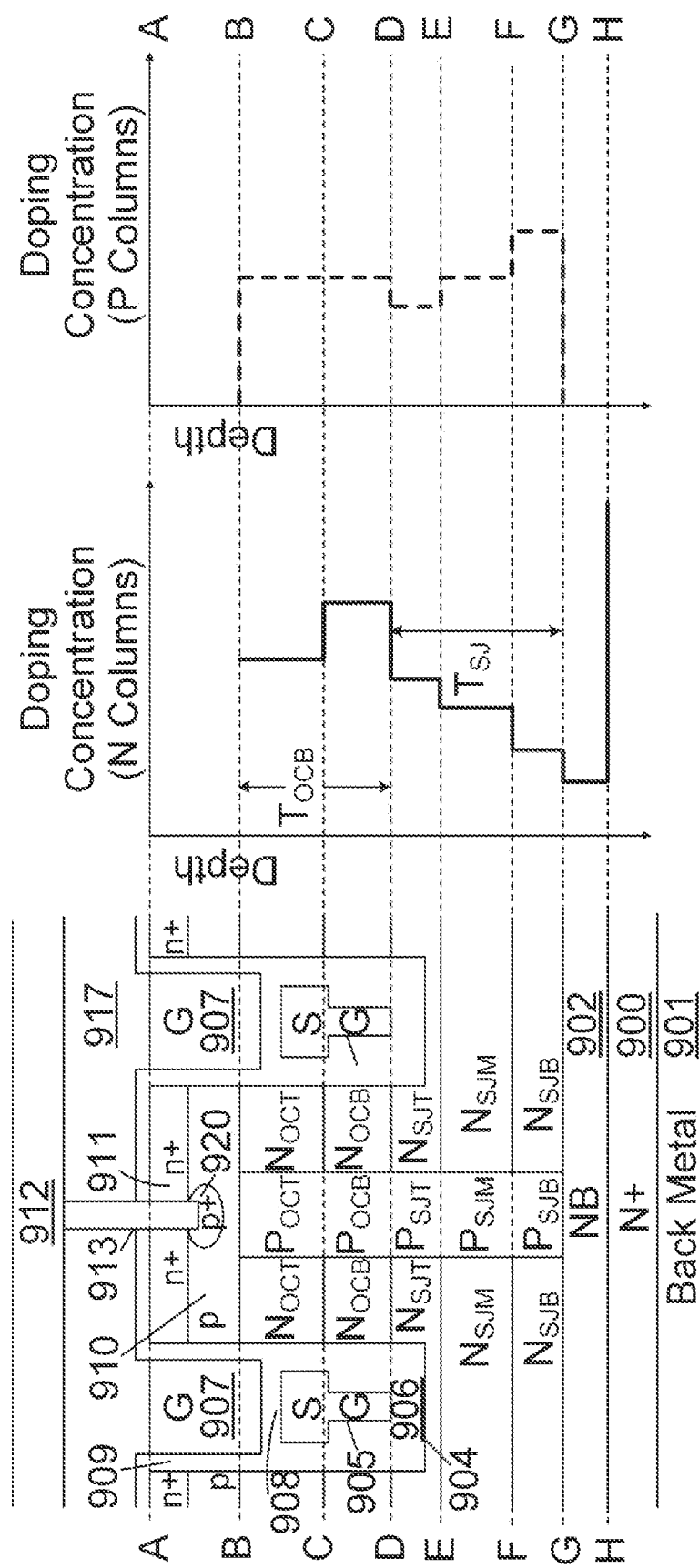
FIG. 9B is the cross-sectional view of the preferred embodiment shown in FIG. 9A, wherein doping concentration variations of the N columns and P columns are depicted separately along the vertical direction according to the present invention.

Please refer to FIG. 9B for the same preferred embodiment of the present invention shown in FIG. 9A, wherein doping concentration variations of the N columns and P columns are depicted separately along the vertical direction according to the present invention.

Figure 10A:
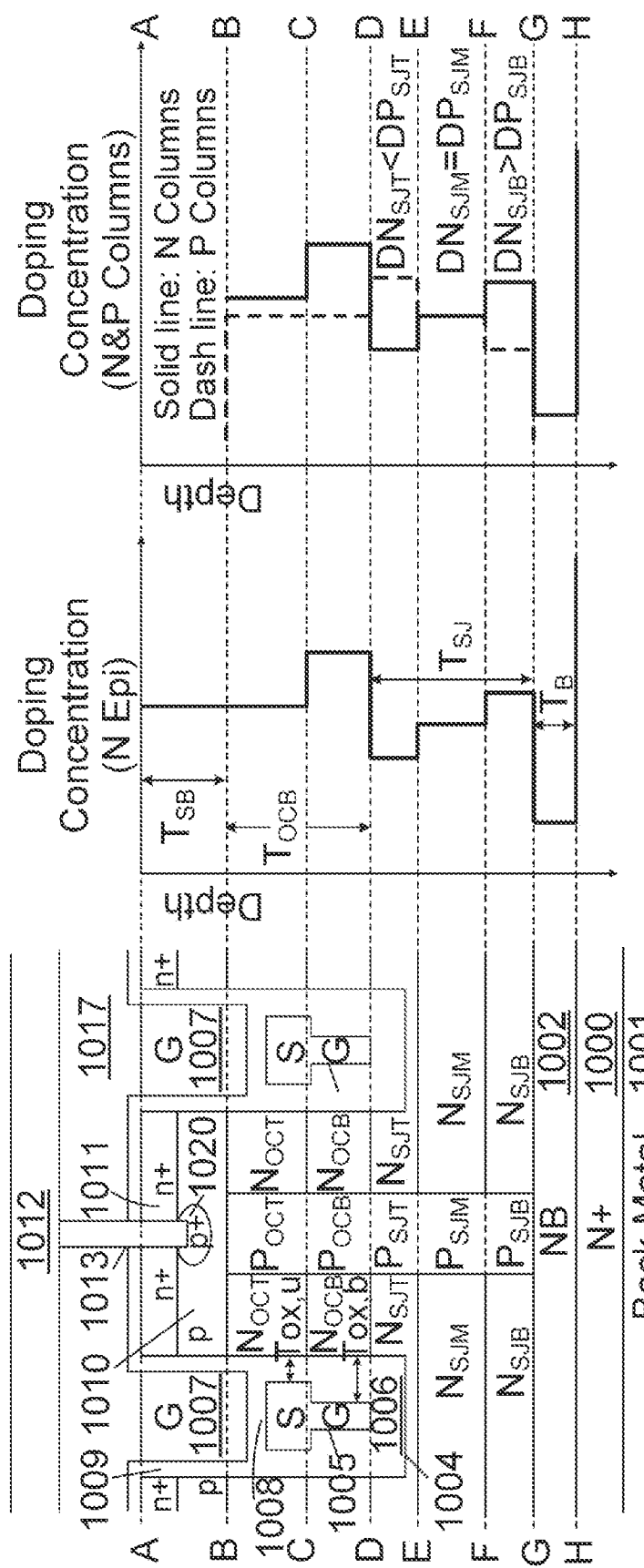
FIG. 10A is a cross-sectional view of another preferred embodiment wherein doping concentration variations of the N type epitaxial layer, the N& P columns are depicted along the vertical direction according to the present invention.

Please refer to FIG. 10A for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 5A, except for the different first insulating film 1006. In the present invention, the first insulating film 1006 in a single trench 1004 has two stepped oxide structure having a lower portion oxide along lower portion sidewalls and bottoms of the gate trenches 1004 with a uniform first thickness Tox,b along trench sidewalls, and an upper portion oxide with a uniform second thickness Tox,u, where Tox,b is greater than Tox,u, to further reduce the on-resistance while maintaining the same breakdown voltage.

Figure 10B:
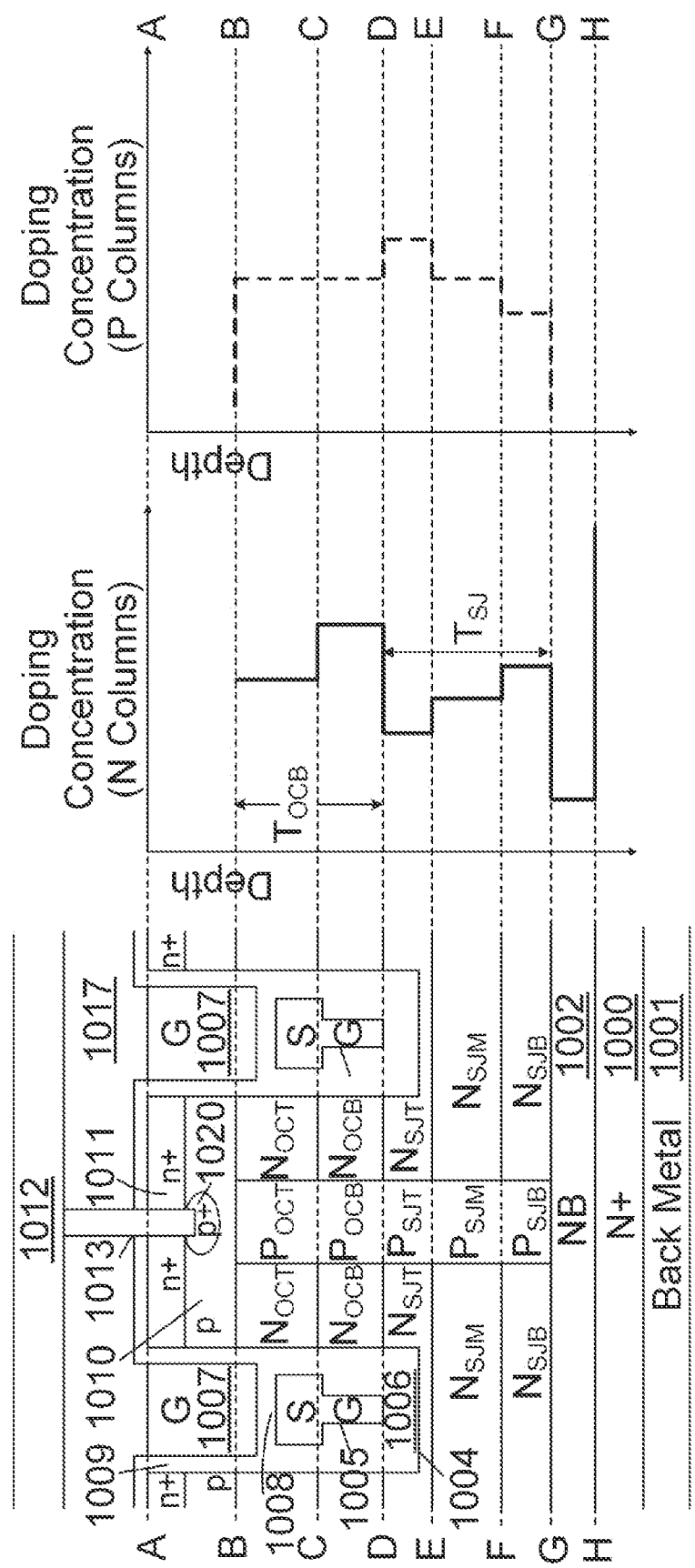
FIG. 10B is the cross-sectional view of the preferred embodiment shown in FIG. 10A, wherein doping concentration variations of the N columns and P columns are depicted separately along the vertical direction according to the present invention.

Please refer to FIG. 10B for the same preferred embodiment of the present invention shown in FIG. 10A, wherein doping concentration variations of the N columns and P columns are depicted separately along the vertical direction according to the present invention.

Figure 11:
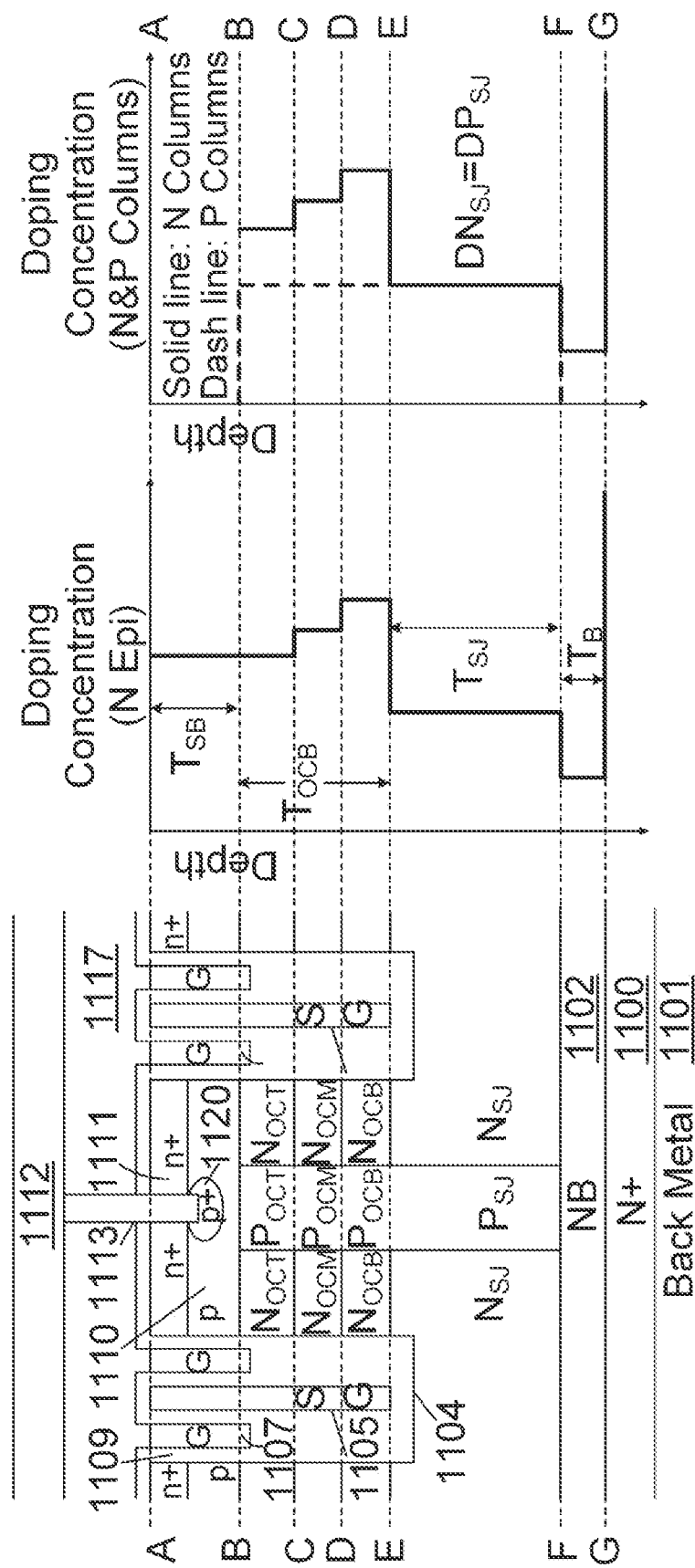
FIG. 11 is a cross-sectional view of another preferred embodiment wherein doping concentration variations of the N type epitaxial layer, the N& P columns are depicted along the vertical direction according to the present invention.

Please refer to FIG. 11 for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 2A, except for the different shielded gate structure in the gate trenches 1104. Inside each of the gate trenches 1104, a shielded gate electrode (SG, as illustrated) 1105 is disposed in the middle and gate electrode (G, as illustrated) 1107 is disposed surrounding upper portions of the shielded electrode 1105.

Figure 12A:
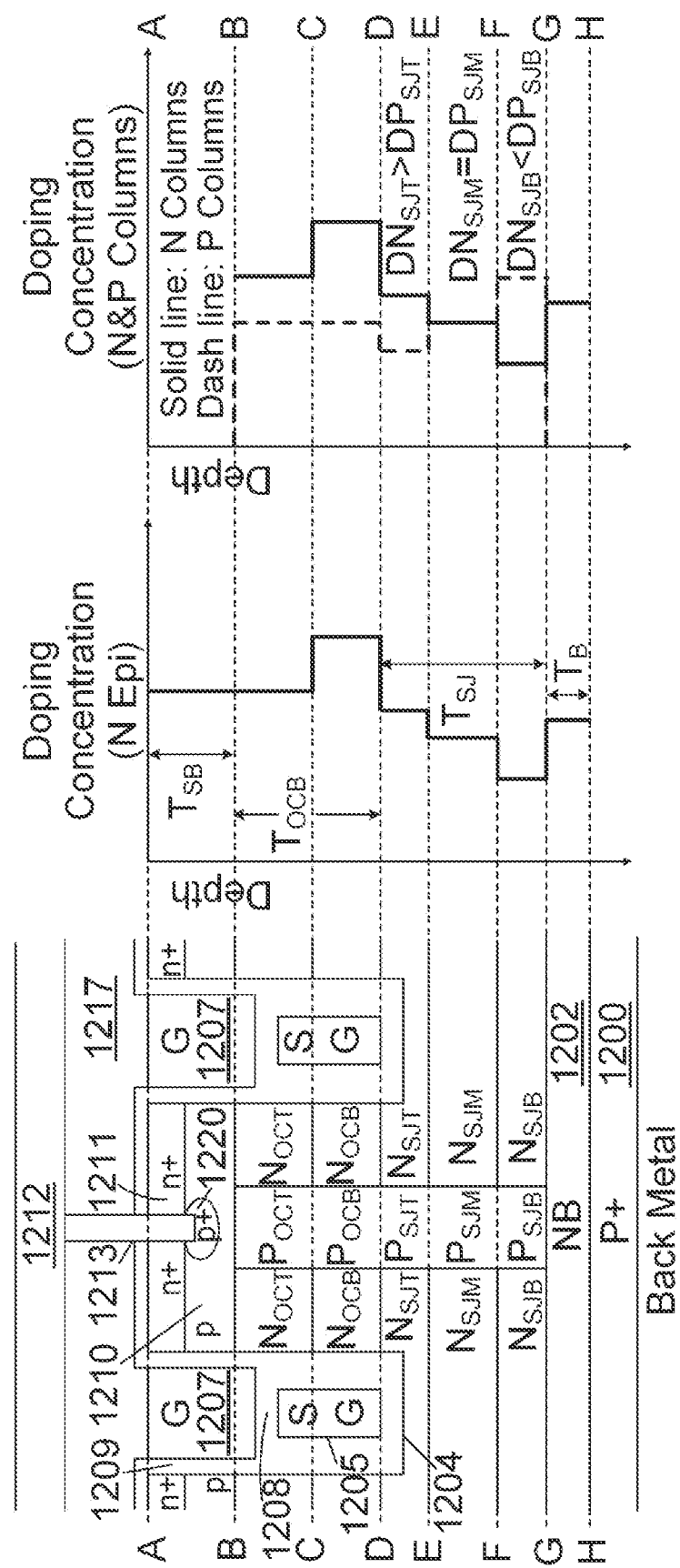
FIG. 12A is a cross-sectional view of another preferred embodiment wherein doping concentration variations of the N type epitaxial layer, the N& P columns are depicted along the vertical direction according to the present invention.

Please refer to FIG. 12A for another preferred embodiment of this invention with new and improved device structure wherein the doping concentration variations of the N type epitaxial layer, the N& P columns as grown are depicted along the vertical direction. The N-channel trenched semiconductor power device representing an IGBT (Insulating Gate Bipolar Transistor) device has a similar structure to FIG. 3A, except for the different substrate. In this invention, the IGBT is formed onto a P+ substrate 1200.

Figure 12B:
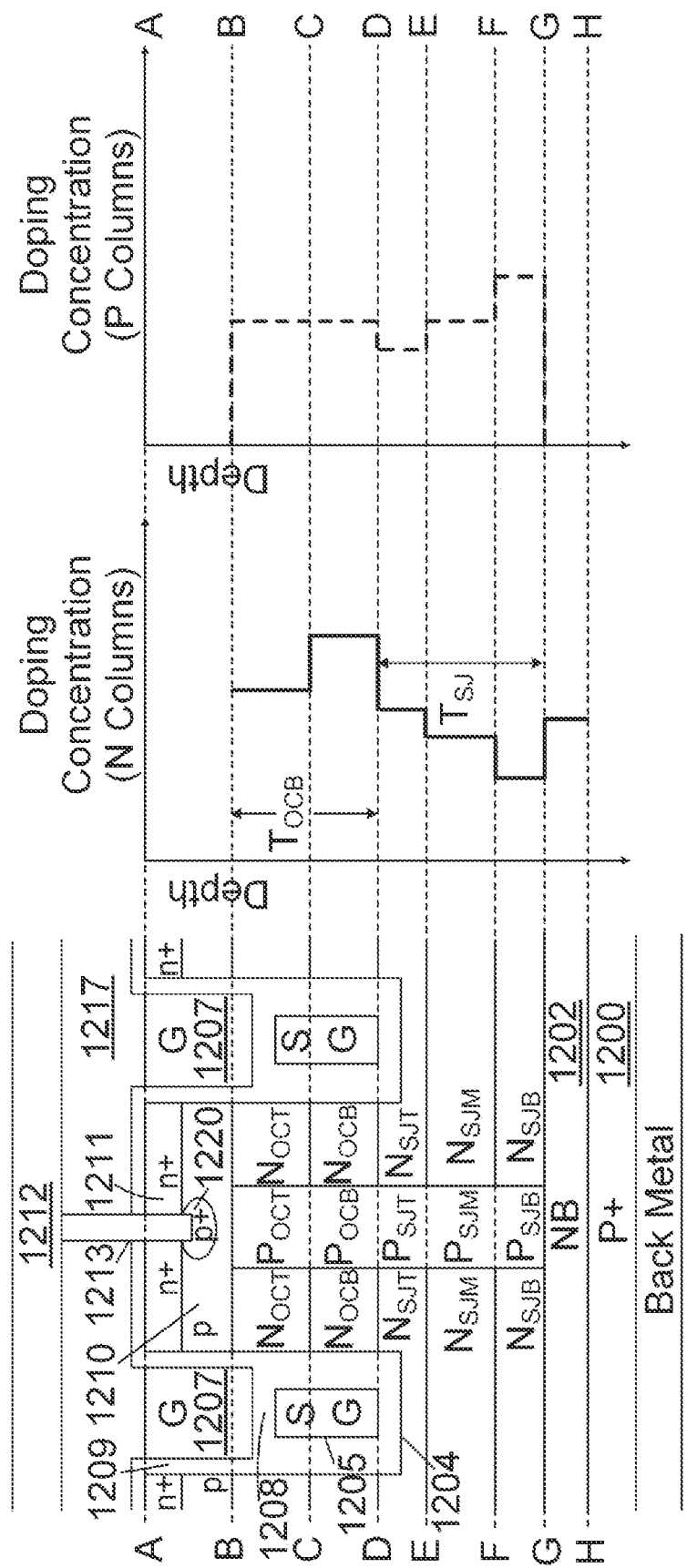
FIG. 12B is the cross-sectional view of the preferred embodiment shown in FIG. 12A, wherein doping concentration variations of the N columns and P columns are depicted separately along the vertical direction according to the present invention.

Please refer to FIG. 12B for the same preferred embodiment of the present invention shown in FIG. 12A, wherein doping concentration variations of the N columns and P columns are depicted separately along the vertical direction according to the present invention.

Figure 13:
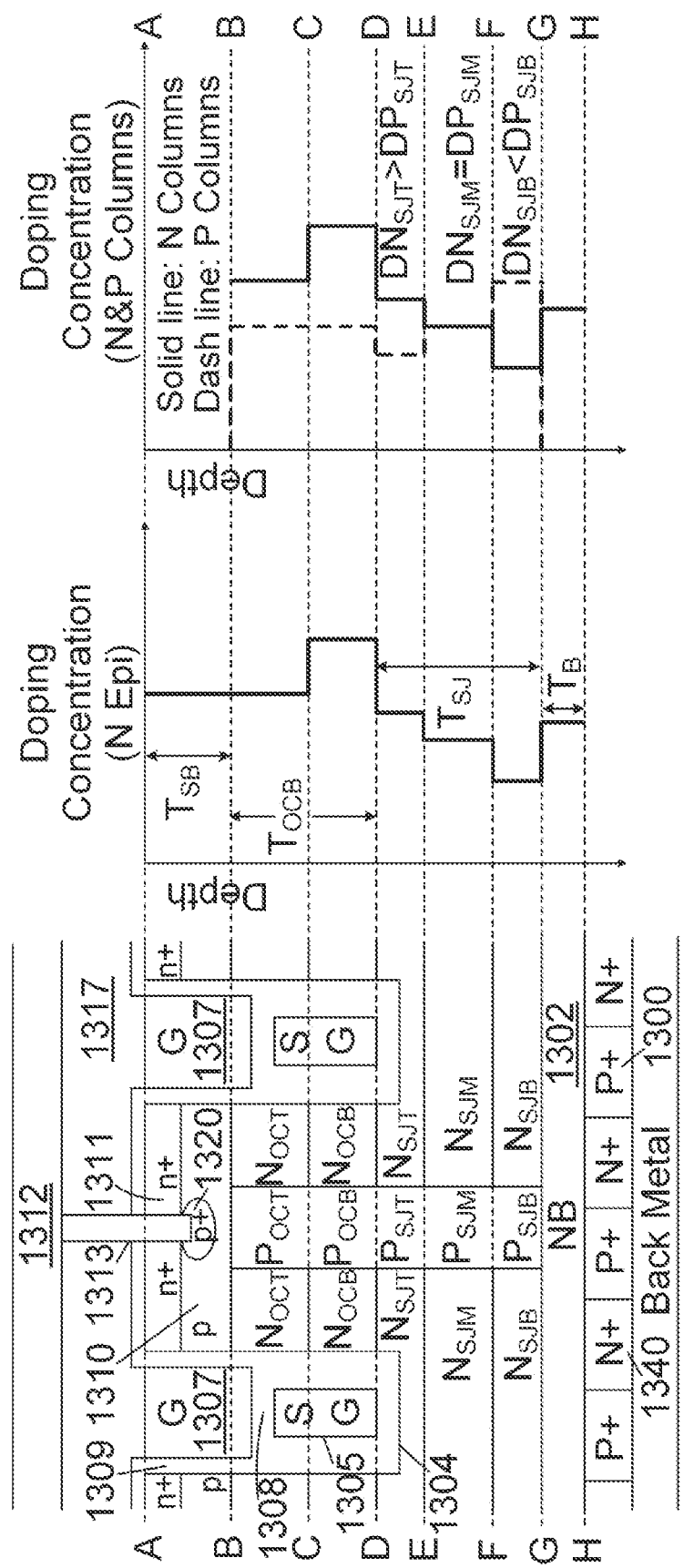
FIG. 13 is a cross-sectional view of another preferred embodiment wherein doping concentration variations of the N type epitaxial layer, the N& P columns are depicted along the vertical direction according to the present invention.

Please refer to FIG. 13 for another preferred embodiment of this invention with new and improved device structure wherein the doping concentration variations of the N type epitaxial layer, the N& P columns as grown are depicted along the vertical direction. The N-channel trenched semiconductor power device has a similar structure to FIG. 12, except that, the IGBT in FIG. 13 further comprises a plurality of heavily doped NI regions 1340 formed in the P+ substrate 1300 to form a plurality of alternating P+ and N+ regions in the substrate.

Figure 14A:
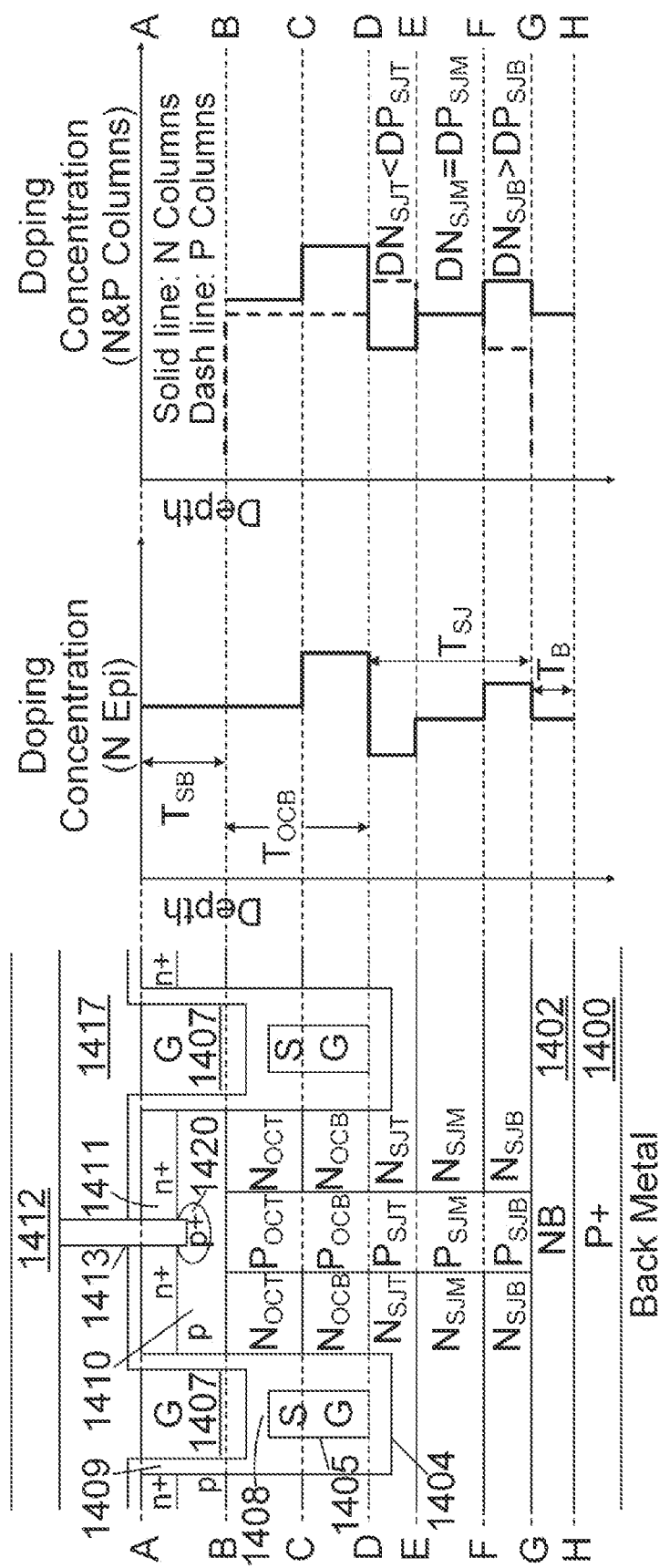
FIG. 14A is a cross-sectional view of another preferred embodiment wherein doping concentration variations of the N type epitaxial layer, the N& P columns are depicted along the vertical direction according to the present invention.

Please refer to FIG. 14A for another preferred embodiment of this invention with new and improved device structure wherein the doping concentration variations of the N type epitaxial layer, the N& P columns as grown are depicted along the vertical direction. The N-channel trenched semiconductor power device representing an IGBT (Insulating Gate Bipolar Transistor) device has a similar structure to FIG. 5A, except for the different substrate. In this invention, the IGBT is formed onto a P+ substrate 1400.

Figure 14B:
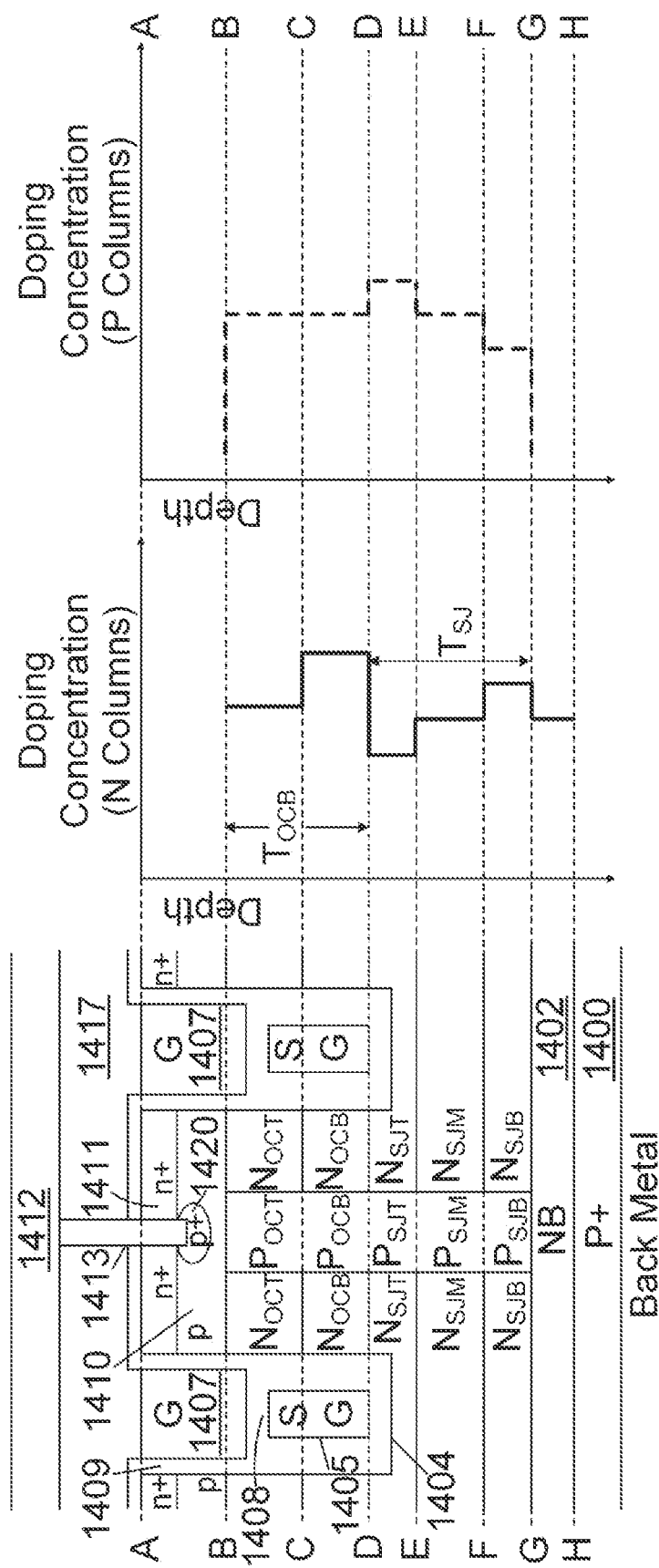
FIG. 14B is the cross-sectional view of the preferred embodiment shown in FIG. 14A, wherein doping concentration variations of the N columns and P columns are depicted separately along the vertical direction according to the present invention.

Please refer to FIG. 14B for the same preferred embodiment of the present invention shown in FIG. 14A, wherein doping concentration variations of the N columns and P columns are depicted separately along the vertical direction according to the present invention.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A shielded gate trench (SGT) superjunction (SJ) MOSFET formed in an epitaxial layer of a first conductivity type onto a substrate of said first conductivity type, comprising:
    a plurality of gate trenches formed in an active area, surrounded by source regions of said first conductivity type are encompassed in body regions of a second conductivity type near a top surface of said epitaxial layer, each of said gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an Inter-Poly Oxide (IPO) film, said gate oxide surrounds said gate electrode and has less thickness than said first insulating film;
    an Oxide Charge Balance (OCB) region formed between two adjacent of said gate trenches below said body regions and above a bottom of said shielded gate electrode;
    said body regions, said shielded gate electrode and said source regions are shorted together to a source metal through a plurality of trench contacts;
    said epitaxial layer in said OCB region has a first type multiple stepped epitaxial (MSE) layers with different doping concentrations decreasing stepwise in a direction from a bottom of said shielded gate electrode toward said body regions along sidewalls of said gate trenches, wherein each of said first type multiple stepped-epitaxial layers has a uniform doping concentration as grown;
    said SGT SJ MOSFET further comprising a SJ region below said OCB region including alternating first doped columns of said first conductivity type and second doped columns of said second conductivity type arranged in parallel and extend from bottoms of said gate trenches toward said substrate wherein each of said second conductivity columns is disposed between two adjacent gate trenches and connected to said body regions; and
    a buffer region of said first conductivity type formed between said substrate and said SJ region.

2. The SGT SJ MOSFET of claim 1, wherein said SJ region between said OCB region and said buffer region has a single epitaxial layer with a uniform doping concentration or multiple epitaxial layers with a same doping concentration for each epitaxial layer, and doping concentrations of said first doped columns are substantially same as doping concentrations of said second doped columns.

3. The SGT SJ MOSFET of claim 1, wherein said SJ region between said OCB region and said buffer region has a second type MSE layers of said first conductivity type with different doping concentrations;
    said doping concentrations of said second type MSE layers and said first doped columns in said SJ region decrease stepwise in a direction from a bottom of said OCB region toward said buffer region, whereas the doping concentrations in said second columns increase stepwise in a direction from a bottom of said OCB region toward said buffer region;
    doping concentrations of said first doped columns are lower than doping concentrations of said second doped columns at a bottom of said SJ region near said buffer region;
    doping concentrations of said first doped columns are higher than doping concentrations of said second doped column at a top of said SJ region near said OCB region; and
    doping concentrations of said first doped columns are substantially same as doping concentrations of said second doped columns at a middle of said SJ region between said top and said bottom of said SJ region.

4. The SGT SJ MOSFET of claim 1, wherein said SJ region between said OCB region and said buffer region has a second type MSE layers of said first conductivity type with different doping concentrations;
    said doping concentrations of said second type MSE layers and said first doped columns in said SJ region increase stepwise in a direction from a bottom of said OCB region toward said buffer region, whereas said doping concentrations in said second columns decrease stepwise in a direction from a bottom of said OCB region toward said buffer region;
    doping concentrations of said first doped columns are higher than doping concentrations of said second doped columns at a bottom of said SJ region near said buffer region;
    doping concentrations of said first doped columns are lower than doping concentrations of said second doped columns at a top of said SJ region near said OCB region, and
    doping concentrations of said first doped columns are substantially same as doping concentrations of said second doped columns at a middle of said SJ region between said top and said bottom of said SJ region.

5. The SGT MOSFET of claim 1, wherein widths of said second doped columns are uniform in a direction from a bottom of said OCB region toward said buffer region.

6. The SGT MOSFET of claim 1, wherein widths of said second doped columns decrease in a direction from a bottom of said OCB region toward said buffer region.

7. The SGT SJ MOSFET of claim 1, wherein said gate electrode is disposed above said shielded gate electrode.

8. The SGT SJ MOSFET of claim 1, wherein said shielded electrode is disposed in the middle and said gate electrode is disposed surrounding upper portions of said shielded electrode.

9. The SGT SJ MOSFET of claim 1, wherein said first type MSE layers in said OCB region comprise at least two stepped epitaxial layers of different doping concentrations including a bottom epitaxial layer with a doping concentration D1 and a top epitaxial layer above said bottom epitaxial layer with a doping concentration D2, wherein said D2<said D1.

10. The SGT SJ MOSFET of claim 1, wherein said first type MSE layers in said OCB region comprise at least three stepped epitaxial layers of different doping concentration including a bottom epitaxial layer with a doping concentration D1, a middle epitaxial layer with a doping concentration D2 and a top epitaxial layer with a doping concentration D3, wherein said D3<said D2<said D1.

11. The SGT MOSFET of claim 1, wherein said epitaxial layer in said source and body regions has a doping concentration same as a top epitaxial layer of said first type MSE layers in said OCB region.

12. The SGT MOSFET of claim 1, wherein widths of said second doped columns in said OCB region is equal to or narrower than widths of said second doped columns in said SJ region.

* * * * *